(12) United States Patent
Tsai et al.

(10) Patent No.: US 11,437,497 B2
(45) Date of Patent: Sep. 6, 2022

(54) SEMICONDUCTOR DEVICE AND METHOD

(71) Applicant: Taiwan Semiconductor Manufacturing Company, Ltd., Hsinchu (TW)

(72) Inventors: Ji-Yin Tsai, Zhudong Township (TW); Jung-Jen Chen, Hsinchu (TW); Pei-Ren Jeng, Chu-Bei (TW); Chii-Horng Li, Zhubei (TW); Kei-Wei Chen, Tainan (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 78 days.

(21) Appl. No.: 16/376,293

(22) Filed: Apr. 5, 2019

(65) Prior Publication Data

US 2020/0006533 A1    Jan. 2, 2020

Related U.S. Application Data

(60) Provisional application No. 62/691,906, filed on Jun. 29, 2018.

(51) Int. Cl.
*H01L 29/66* (2006.01)
*H01L 29/161* (2006.01)
(Continued)

(52) U.S. Cl.
CPC ...... *H01L 29/66818* (2013.01); *H01L 21/223* (2013.01); *H01L 29/161* (2013.01);
(Continued)

(58) Field of Classification Search
CPC ............ H01L 29/66818; H01L 29/161; H01L 21/223; H01L 29/7849; H01L 29/785;
(Continued)

(56) References Cited

U.S. PATENT DOCUMENTS 9,093,530 B2    7/2015    Huang et al.
9,171,929 B2    10/2015    Lee et al.
(Continued)

FOREIGN PATENT DOCUMENTS

JP    2014063929 A    4/2014
KR    20160020042 A    2/2016
(Continued)

*Primary Examiner* — Shahed Ahmed
*Assistant Examiner* — Sun Mi Kim King
(74) *Attorney, Agent, or Firm* — Slater Matsil, LLP

(57) ABSTRACT

In an embodiment, a device includes: a substrate; a first semiconductor region extending from the substrate, the first semiconductor region including silicon; a second semiconductor region on the first semiconductor region, the second semiconductor region including silicon germanium, edge portions of the second semiconductor region having a first germanium concentration, a center portion of the second semiconductor region having a second germanium concentration less than the first germanium concentration; a gate stack on the second semiconductor region; and source and drain regions in the second semiconductor region, the source and drain regions being adjacent the gate stack.

20 Claims, 27 Drawing Sheets

(51) Int. Cl.
   *H01L 21/223* (2006.01)
   *H01L 29/78* (2006.01)
   *H01L 21/306* (2006.01)
   *H01L 21/02* (2006.01)

(52) U.S. Cl.
   CPC ........ *H01L 29/785* (2013.01); *H01L 29/7849* (2013.01); *H01L 21/02236* (2013.01); *H01L 21/306* (2013.01)

(58) Field of Classification Search
   CPC ............. H01L 21/306; H01L 21/02236; H01L 29/7851; H01L 29/1054; H01L 29/66545; H01L 29/66795
   See application file for complete search history.

(56) References Cited

U.S. PATENT DOCUMENTS

| | | | |
|---|---|---|---|
| 9,214,555 B2 | 12/2015 | Oxland et al. | |
| 9,236,267 B2 | 1/2016 | De et al. | |
| 9,379,182 B1* | 6/2016 | Chen | H01L 21/02535 |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,859,387 B2 | 1/2018 | Kim et al. | |
| 9,985,134 B1 | 5/2018 | Lin et al. | |
| 2011/0147811 A1 | 6/2011 | Kavalieros et al. | |
| 2012/0241818 A1 | 9/2012 | Kavalieros et al. | |
| 2014/0197456 A1* | 7/2014 | Wang | H01L 29/66795 257/192 |
| 2016/0049335 A1 | 2/2016 | Liu et al. | |
| 2016/0087098 A1* | 3/2016 | Liu | H01L 29/0847 257/344 |
| 2016/0254383 A1 | 9/2016 | Wann et al. | |
| 2016/0268378 A1* | 9/2016 | Hashemi | H01L 21/823412 |
| 2017/0352759 A1 | 12/2017 | Kim et al. | |
| 2018/0130802 A1* | 5/2018 | Wang | H01L 27/0928 |
| 2018/0175200 A1 | 6/2018 | Lee et al. | |

FOREIGN PATENT DOCUMENTS

| | | |
|---|---|---|
| KR | 20160119889 A | 10/2016 |
| KR | 20180060940 A | 6/2018 |

* cited by examiner

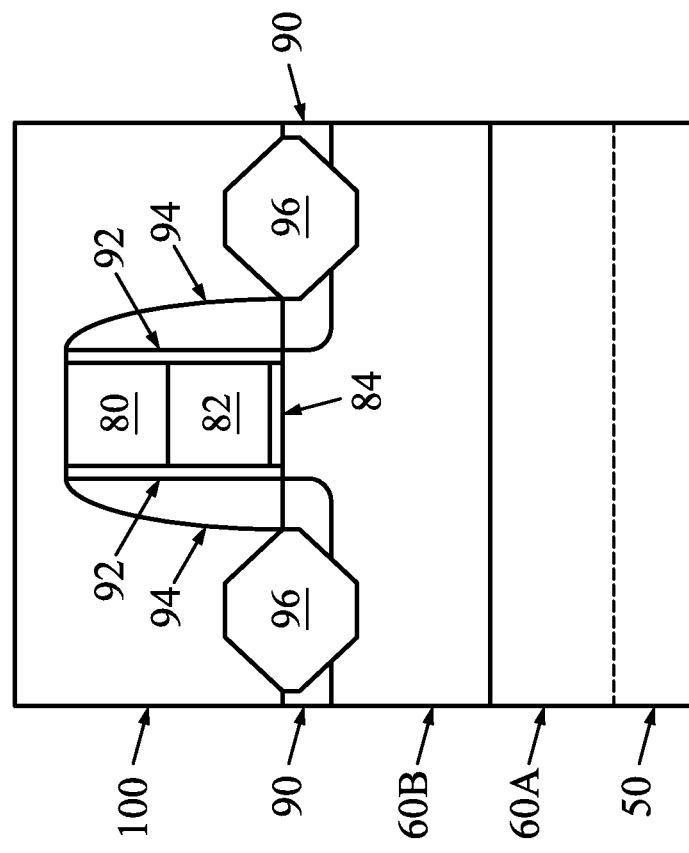
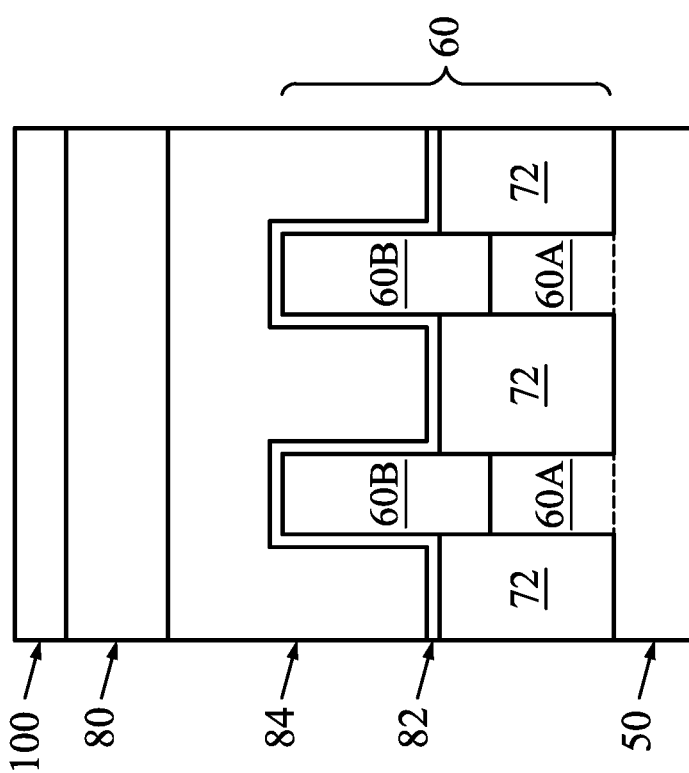
Figure 16A
Figure 16B

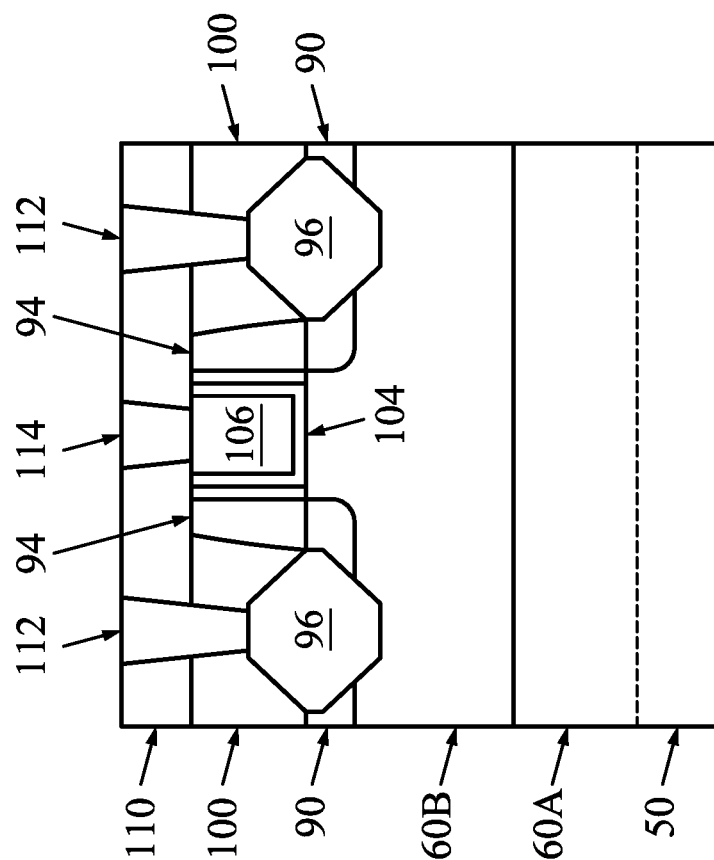
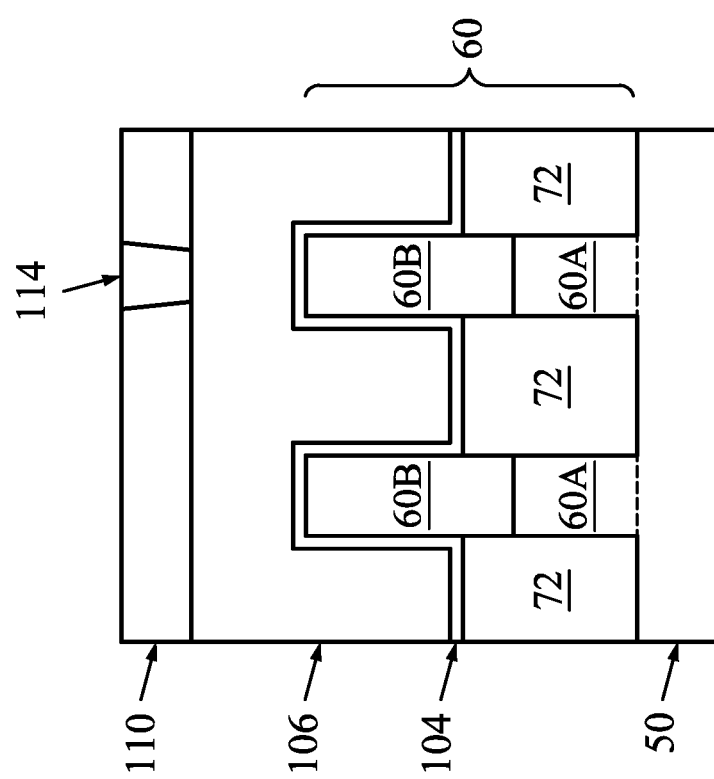

SEMICONDUCTOR DEVICE AND METHOD

PRIORITY CLAIM AND CROSS-REFERENCE

This application claims the benefit of and priority to U.S. Provisional Patent Application No. 62/691,906, filed on Jun. 29, 2018, entitled "Semiconductor Device and Method," which is incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 20B are cross-sectional views of intermediate stages in the manufacturing of FinFETs, in accordance with some embodiments.

FIGS. 23A through 24B are cross-sectional views of intermediate stages in the manufacturing of FinFETs, in accordance with some other embodiments.

DETAILED DESCRIPTION

Figure 1:
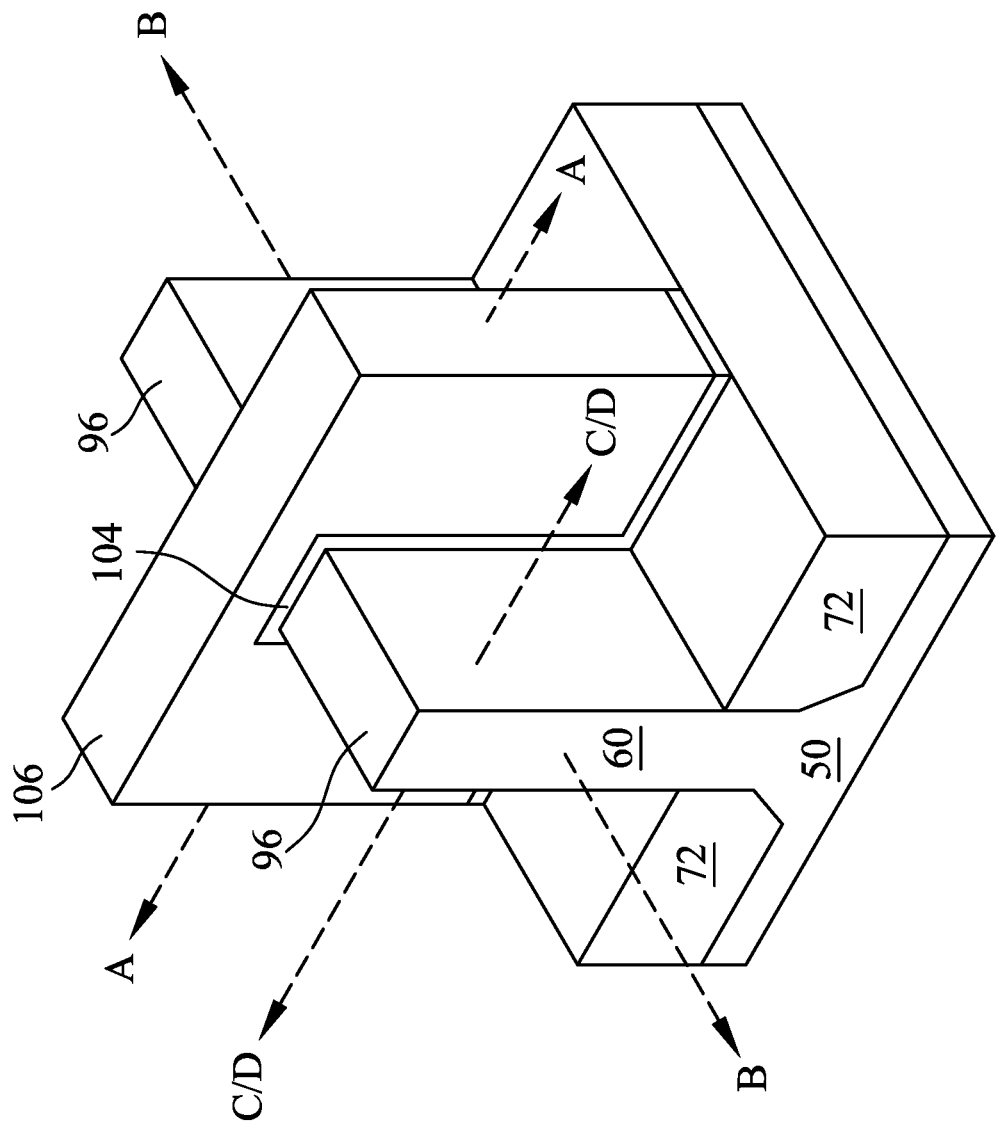
FIG. 1 illustrates an example of a Fin Field Effect Transistor (FinFET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a substrate of a first semiconductor material (e.g., silicon) is provided, and a layer of a second semiconductor material (e.g., silicon germanium) is formed on the substrate. The second semiconductor material may have a low germanium concentration. Trenches are etched to form fins from the first and second semiconductor materials. An oxidation process is performed to form an oxide layer on sidewalls of the fins. During oxidation, the germanium of the second semiconductor material is condensed along the sidewalls of the fins. The oxide layer is then removed. By condensing the germanium along the sidewalls of the fins, the germanium concentration in the channel regions of the fins may be increased. Because the fins are initially formed with a low germanium concentration, they have a lower amount of compressive strain, and thus deformation of the fins during trench etching may be reduced.

FIG. 1 illustrates an example of a FinFET in a three-dimensional view, in accordance with some embodiments. The FinFET comprises a fin 60 on a substrate 50. Shallow trench isolation (STI) regions 72 are formed on the substrate 50, and the fin 60 protrudes above and from between neighboring STI regions 72. A gate dielectric layer 104 is along sidewalls and over a top surface of the fin 60, and a gate electrode 106 is over the gate dielectric layer 104. Source/drain regions 96 are disposed in opposite sides of the fin 60 with respect to the gate dielectric layer 104 and gate electrode 106.

FIG. 1 further illustrates reference cross-sections that are used in later figures. Cross-section A-A is across a channel, gate dielectric layer 104, and gate electrode 106 of the FinFET. Cross-section B-B is perpendicular to cross-section A-A and is along a longitudinal axis of the fin 60 and in a direction of, for example, a current flow between the source/drain regions 96. Cross-section C/D-C/D is parallel to cross-section A-A and extends through a source/drain region 96 of the FinFET Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 13 are cross-sectional views of intermediate stages in the manufacturing of FinFETs, in accordance with some embodiments. FIGS. 2 through 13 are shown along reference cross-section A-A illustrated in FIG. 1, except for multiple fins/FinFETs.

Figure 2:
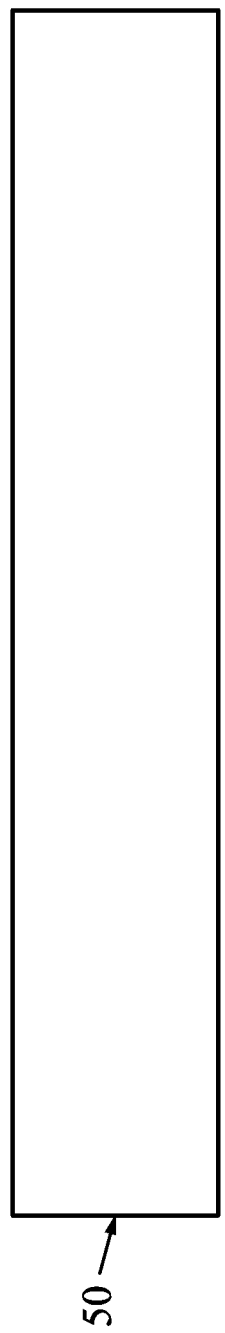

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 50 includes silicon, e.g., the substrate 50 is a silicon substrate such as a wafer. In some embodiments, the semiconductor material of the substrate 50 may also include germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

One region of the substrate 50 is illustrated. The illustrated region can be for forming n-type devices, such as NMOS transistors, e.g., n-type FinFETs, or for forming p-type devices, such as PMOS transistors, e.g., p-type FinFETs. Some embodiments discussed herein are discussed in the context of forming p-type devices in the illustrated region. N-type devices may be formed in other regions of the substrate 50. During processes for forming p-type devices, the regions for forming n-type devices may be covered by a mask such as a photoresist.

In some embodiments, the substrate 50 is doped to have appropriate doped regions (sometimes referred to as well regions). In embodiments where p-type devices are formed the illustrated region, an n-type doped region may be formed in the substrate 50. In some embodiment, the n-type doped region may be formed by implanting n-type impurities in the region of the substrate 50. In some embodiments, the substrate 50 may be provided pre-doped with n-type impurities. The n-type impurities may be phosphorus, arsenic, or the like, and may be formed in the region to a concentration of equal to or less than $10^{18}$ cm$^{-3}$, such as from about $10^{17}$ cm$^{-3}$ to about $10^{18}$ cm$^{-3}$. In embodiments where n-type devices are formed the illustrated region, a p-type doped region may be formed in the substrate 50. In some embodiment, the p-type doped region may be formed by implanting p-type impurities in the region of the substrate 50. In some embodiments, the substrate 50 may be provided pre-doped with p-type impurities. The p-type impurities may be boron, BF$_2$, or the like, and may be formed in the region to a concentration of equal to or less than $10^{18}$ cm$^{-3}$, such as from about $10^{17}$ cm$^{-3}$ to about $10^{18}$ cm$^{-3}$.

Figure 3:
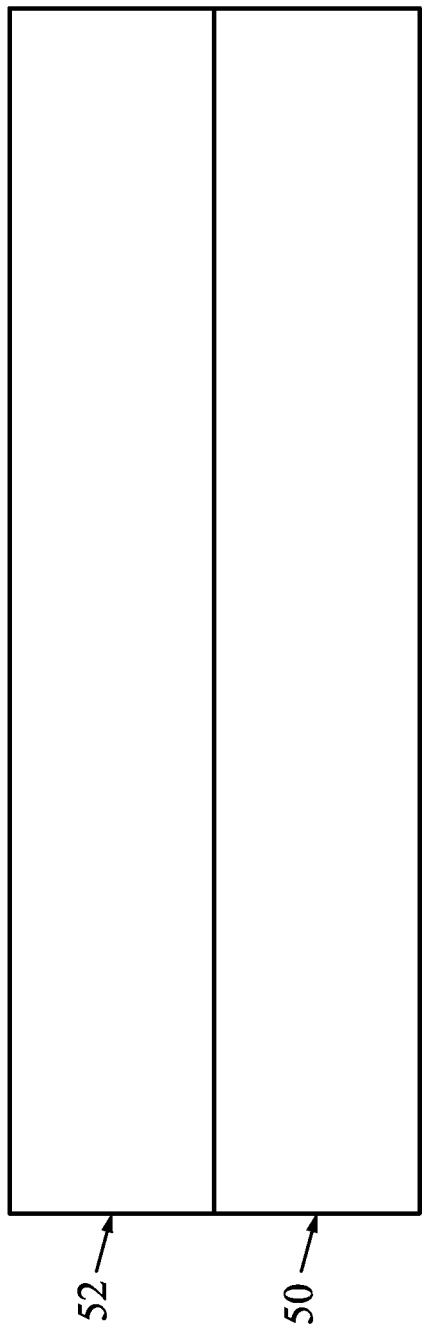

In FIG. 3, a semiconductor layer 52 is formed on the substrate 50. In some embodiments, the semiconductor layer 52 is epitaxially grown on the substrate 50. In some embodiments, the semiconductor layer 52 is a bulk semiconductor, such as a wafer, and is bonded to the substrate 50 by, e.g., wafer bonding. In embodiments where p-type devices are formed, the semiconductor layer 52 is a semiconductor material including germanium, such as silicon germanium ($Si_xGe_{1-x}$, where x can be in the range of 0 to 1). The semiconductor layer 52 may be formed with a low germanium concentration, such as a concentration of from about 0 to about 50%, which may provide enough strain to boost mobility without generating dislocation defects when the thickness of the semiconductor layer 52 reaches a desired channel height. It should be appreciated that the target low germanium concentration may change based on the design and desired parameters of the final device. Silicon and silicon germanium have different lattice constants. As such, the semiconductor layer 52 and substrate 50 have mismatched lattice constants. The lattice constant mismatch depends on the germanium concentration in the semiconductor layer 52, where a higher germanium concentration results in a greater lattice constant mismatch. The lattice constant mismatch induces a compressive strain in the semiconductor layer 52, which may increase the carrier mobility of the semiconductor layer 52, which may improve the channel region mobility of subsequently formed p-type devices. Because the germanium concentration of the semiconductor layer 52 is low, the lattice constant mismatch and amount of compressive strain is also low.

In some embodiments, the semiconductor layer 52 is in situ doped during growth to have appropriate doped regions (sometimes referred to as well regions). The doped regions of the semiconductor layer 52 may be of the same doping type as the underlying doped regions of the substrate 50. The doped regions of the semiconductor layer 52 may have the same doping concentration as the underlying doped regions of the substrate 50, or may have a different doping concentration.

Figure 4:
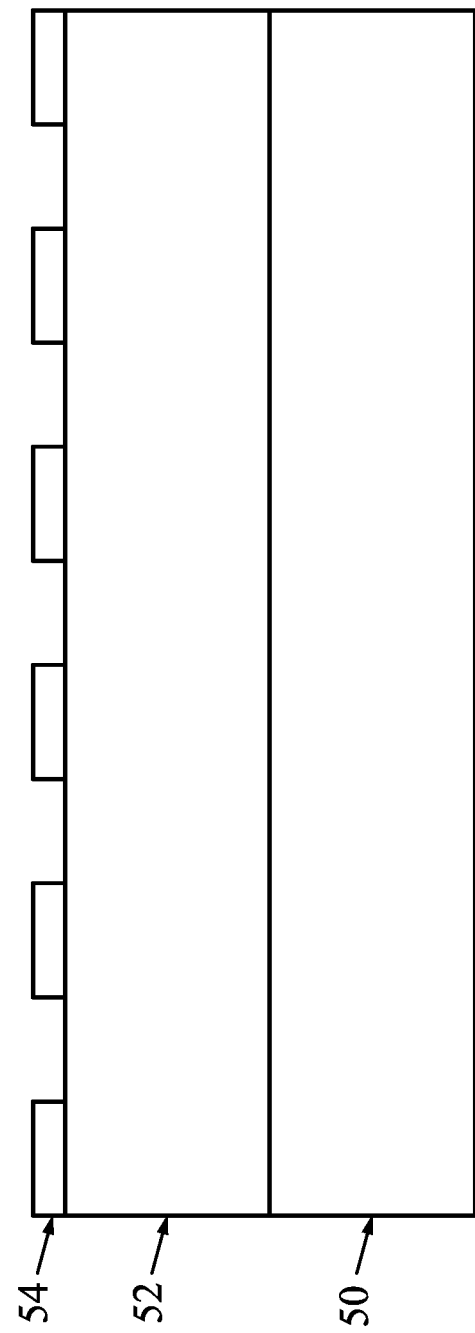

In FIG. 4, a mask 54 is formed on the semiconductor layer 52. The mask 54 may be formed by forming a masking layer on the on the semiconductor layer 52, and patterning the masking layer. The masking layer may be formed of a material that includes a metal, such as titanium nitride, titanium, tantalum nitride, tantalum, or the like, and may be formed by physical vapor deposition (PVD), radio frequency PVD (RFPVD), atomic layer deposition (ALD), or the like. The masking layer may also be formed of a non-metallic material, such as SiN. After formation, the masking layer is patterned using an acceptable etching process. The etching process may be any acceptable etch process, such as a wet etch, a dry etch, a reactive ion etch, a neutral beam etch, the like. Remaining portions of the masking layer forming the mask 54.

Figure 5:
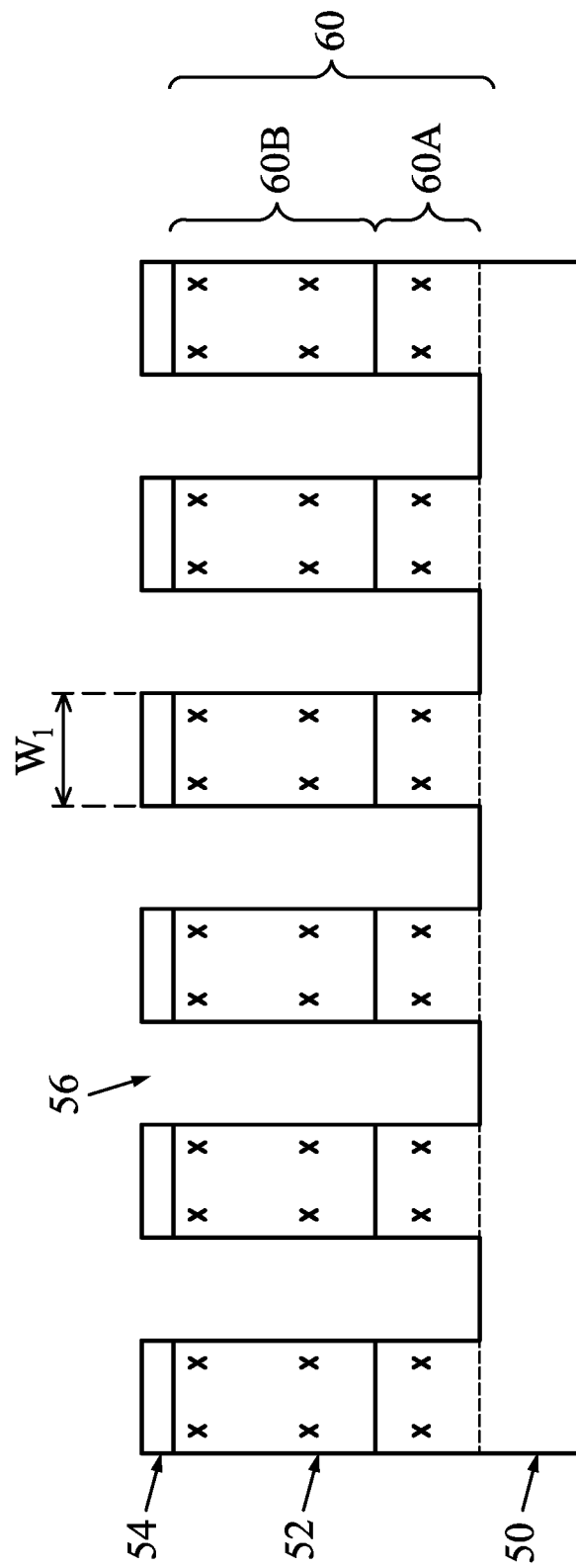

In FIG. 5, trenches 56 are formed in the semiconductor layer 52, corresponding to the pattern of the mask 54. The trenches 56 may be formed by one or more etching process (es), using the mask 54 as an etching mask. The etching process(es) may include a wet etch, a dry etch, a reactive ion etch (RIE), a neutral beam etch (NBE), a combination thereof, or the like, and may be anisotropic. The trenches 56 may extend partially into the semiconductor layer 52, or may extend through the semiconductor layer 52 and into the substrate 50. Portions of the semiconductor layer 52 (and optionally the substrate 50) remaining between the trenches 56 are referred to as fins 60. The fins 60 include a first portion 60A comprising portions of the substrate 50, and a second portion 60B comprising portions of the semiconductor layer 52. The fins 60 are initially formed to a width $W_1$. In some embodiments, the width $W_1$ is from about 8 nm to about 20 nm. It should be appreciated that the width $W_1$ may change based on the layout or design of the fins 60.

As a result of the etching process, sidewalls of the fins 60 exposed by the trenches 56 may be damaged. The damage may include atom displacement, vacancies, and/or the like, which are symbolized by "X" signs. In some embodiments, the etching process omits a cleaning process (such as a Cl ash or a wet clean) for repairing the damage. In some embodiments, the cleaning process may be performed.

The fins 60 are semiconductor strips. When the semiconductor layer 52 is etched to form the second portions 60B of the fins 60, sidewalls of the fins 60 are exposed and have no lateral constraints, e.g., are exposed to free space and are not surrounded or supported by other structures or materials. As noted above, the semiconductor layer 52 is strained. Because sidewalls of the fins 60 are unconstrained during the etching, the strain in the semiconductor layer 52 is released during the etching. The shape of the semiconductor material may change when the strain is released, deforming the fins 60 such that they do not have an ideal fin shape. In particular, the fins 60 may deform such that the semiconductor strips are not straight strips in a top-down view. The deformed fins 60 may bend or curve as they extend along the substrate 50. The amount of deformity of the fins 60 depends on the amount of strain released from the semiconductor layer 52. The risk of fin deformity may be exacerbated when the fins 60 are formed with narrower widths or greater heights. Excessive deformation may decrease the yield of the fins 60, and may also decrease the carrier mobility of the fins 60. Because the semiconductor layer 52 is formed with a low germanium concentration, the amount of strain released is low. By forming the semiconductor layer 52 with a low germanium concentration, the carrier mobility gained by avoiding fin deformation may be greater than the carrier mobility lost by reducing germanium concentration.

Figure 6:
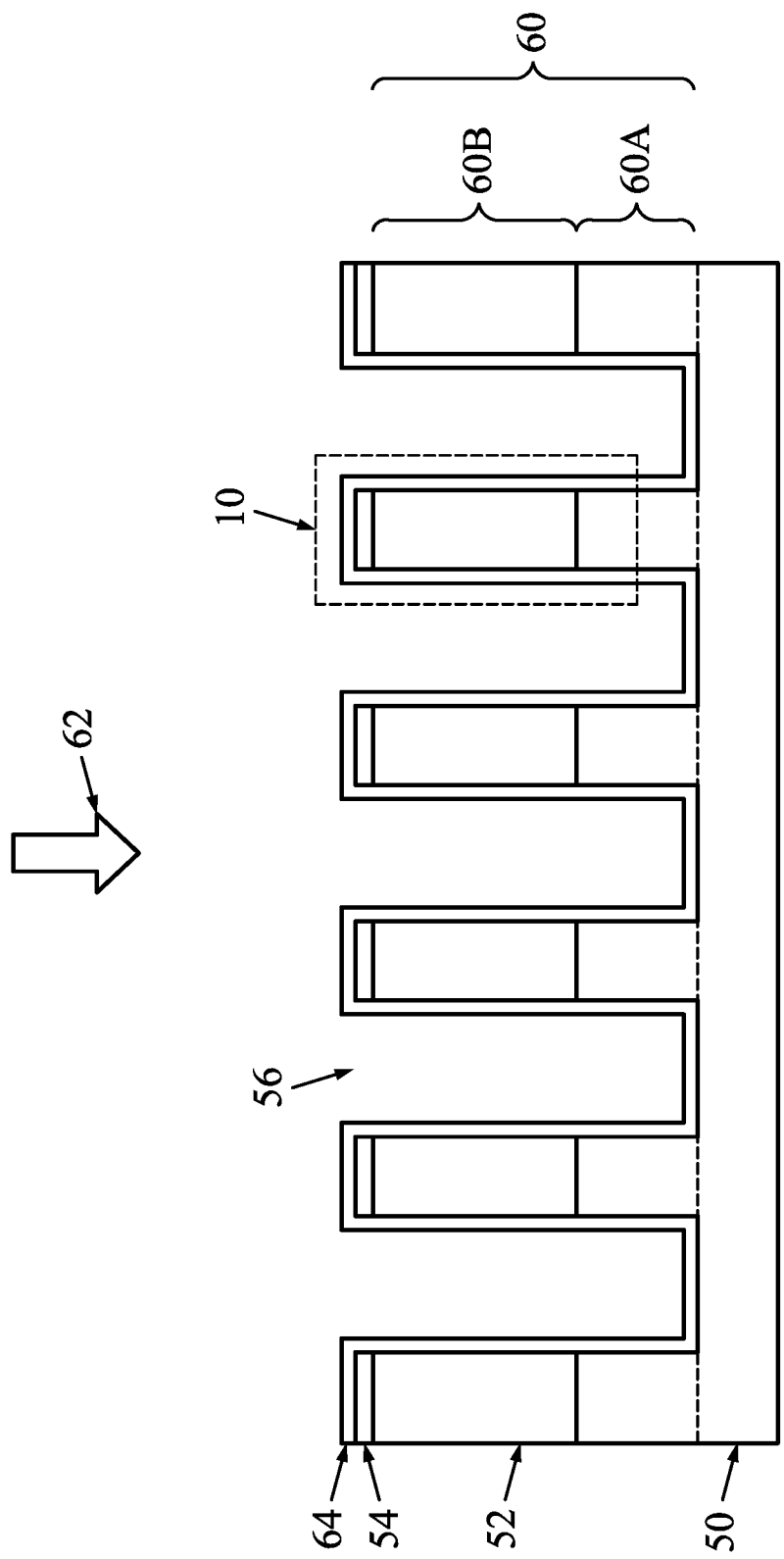

In FIG. 6, an oxidation process 62 is performed to form an oxide layer 64. The oxide layer 64 extends along exposed sidewalls of the fins 60, exposed sidewalls of the mask 54, and top surfaces of the mask 54 and substrate 50. The oxidation process 62 may be a rapid thermal oxidation (RTO) process, a chemical oxidation process, an in-situ stream generation (ISSG) process, an enhanced in-situ stream generation (EISSG) process, or the like. For example, the oxidation process 62 may include a rapid thermal anneal (RTA) that is performed in an oxygen-containing environment. Water vapor, molecular oxygen, ozone, or other oxygen sources may be introduced to the environment to increase the oxygen level of the environment. The oxidation temperature may contribute to the thickness of the oxide layer 64; higher temperatures of the oxidation process 62 may result in a thicker oxide layer 64. In some embodiment, the oxidation process 62 is performed at a temperature of from about 600° C. to about 1200° C. The oxidation time span may also contribute to the thickness of the oxide layer 64; longer oxidation time spans of the oxidation process 62 may result in a thicker oxide layer 64. In some embodiment, the oxidation process 62 is performed for a time span of from several seconds to several hours, such as from about 5 seconds to about 12 hours. It should be appreciated that the oxidation duration may vary based on the oxidation conditions and environment. The pressure of the environment may also contribute to the thickness of the oxide layer 64; higher pressure levels of the oxidation process 62 may result in a thicker oxide layer 64. In some embodiments, the oxidation process 62 is performed at a pressure of from about 0.1 Torr to about 20 atm.

Figure 7:
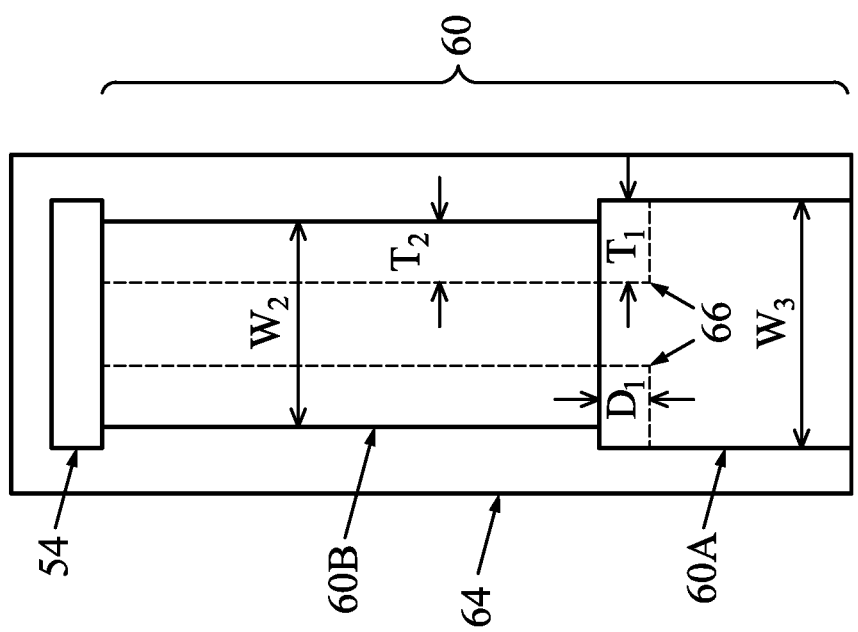

FIG. 7 is a detailed view of a region 10 in FIG. 6, showing additional features of a fin 60. As shown, oxidizing the fins 60 consumes some of the semiconductor material of the fins 60. The damaged sidewalls of the fins 60 may be consumed by the oxidation process 62. As such, the remaining sidewalls of the fins 60 (now covered by the oxide layer 64), may not be damaged, or at least may be less damaged. The oxidation process 62 may thus be said to repair the damaged sidewalls of the fins 60. As will be discussed further below, the oxide layer 64 will be subsequently removed. The portions of the fins 60 remaining after removal of the oxide layer 64 are thinner than the widths of the fins 60 before the oxidation process 62. As such, the final width of the fins 60 may be controlled by varying the parameters of the oxidation process 62 to control the thickness of the oxide layer 64. Further, because silicon germanium has a higher oxidation rate than silicon, the second portions 60B of the fins 60 oxidize more than the first portions 60A of the fins 60. Thus, after oxidation, the second portions 60B of the fins 60 have a second width $W_2$ which is less than a third width $W_3$ of the first portions 60A of the fins 60. Both of the final widths $W_2$ and $W_3$ are less than the initial widths $W_1$ of the fins 60. In some embodiments, the width $W_2$ is less than about 20 nm, and the width $W_3$ is from about 6 nm to about 20 nm.

Further, germanium-rich layers 66 are formed in the second portions 60B of the fins 60. The germanium-rich layers 66 are formed by the oxidation process 62. Silicon and oxygen have a greater chemical affinity than germanium and oxygen. As such, the oxide layer 64 is predominantly silicon oxide. Further, germanium is not soluble in silicon oxide, and the germanium of the second portions 60B of the fins 60 is largely rejected from the germanium-rich layers 66. As a result, when the sidewall portions of the fins 60 are consumed to form the oxide layer 64, the germanium in those sidewall portions is driven away from the oxide layer 64, towards centers of the fins 60. Some germanium may also be driven downwards, such that the germanium-rich layers 66 also extend into the first portions 60A of the fins 60. The resulting germanium-rich layers 66 are in sidewalls of the first portions 60A and second portions 60B of the fins 60. As such, edge regions of the first portions 60A and second portions 60B of the fins 60 have a higher germanium concentration than center regions of the first portions 60A and second portions 60B of the fins 60. The germanium-rich layers 66 may have the same or different concentrations in the first portions 60A and second portions 60B of the fins 60. In some embodiments, the germanium-rich layers 66 in the first portions 60A of the fins 60 have a lower germanium concentration than the germanium-rich layers 66 in the second portions 60B of the fins 60. The germanium-rich layers 66 in the second portions 60B of the fins 60 may have a germanium concentration of up to about 100%. The maximum germanium concentration that can be reached before fin deformation is determined by the desired dimensions of the fins 60, and embodiments may allow the concentration of the germanium-rich layers 66 to approach that maximum level.

The width of the germanium-rich layers 66 depends on the width of the oxide layer 64. By varying the parameters of the oxidation process 62, the width of the germanium-rich layers 66 can be varied from a few monolayers to substantially the entire width of the fins 60. The germanium-rich layers 66 in the first portions 60A of the fins 60 are formed to a thickness $T_1$, and the germanium-rich layers 66 in the second portions 60B of the fins 60 are formed to a thickness $T_2$ than the thickness $T_1$. In some embodiments, the thickness $T_1$ is up to about half of the third width $W_3$, and the thickness $T_2$ is up to about half of the second width $W_2$. The germanium diffusion may be isotropic, and so the germanium-rich layers 66 in the first portions 60A also extend towards the substrate by a distance $D_1$. In some embodiments, the distance $D_1$ is up to half of the third width $W_3$.

Although the semiconductor layer 52 (see FIG. 6) is formed with a low germanium concentration, forming the germanium-rich layers 66 allows the germanium concentration of the fins 60 to be increased. Forming the fins 60 with a low initial germanium concentration may help avoid deformation of the fins 60 during formation. Increasing the germanium concentration of the fins 60 after formation may allow the carrier mobility of the fins 60 to be increased without the downside of increased fin deformation. Further, because the germanium-rich layers 66 are near the sidewalls of the fins 60, they may be close to the gates of the subsequently formed p-type devices, allowing the channel region mobility of the subsequently formed p-type devices to be increased. The final strain of the fins 60 may also be higher than the initial strain of the fins 60.

Figure 8:
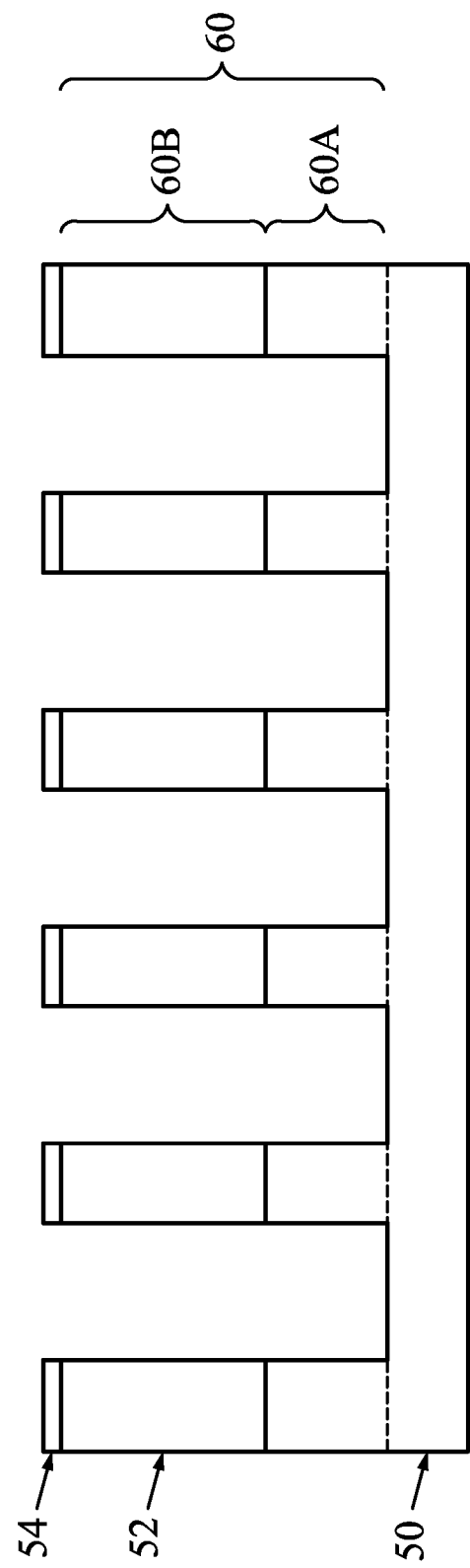

In FIG. 8, the oxide layer 64 is removed. The removal may be by a dry etch or a wet etch. The dry etch may be performed with etchants including $CHF_3$, $CF_4$, or the like, and the wet etch may be performed with etchants including hot or cold dHF acid or the like. The etch may be isotropic or anisotropic, depending on whether the oxide layer 64 should be completely removed. In some embodiments, some of the oxide layer 64 remains and may be removed after the subsequent processing. In the embodiment shown, the oxide layer 64 is removed after formation of the germanium-rich layers 66, before further processing is performed. In some embodiments other processes may be performed after formation of the germanium-rich layers 66, and the oxide layer 64 may not be removed until after the subsequent processing. The oxide layer 64 may act as a protective layer during the subsequent processing.

Figure 9:
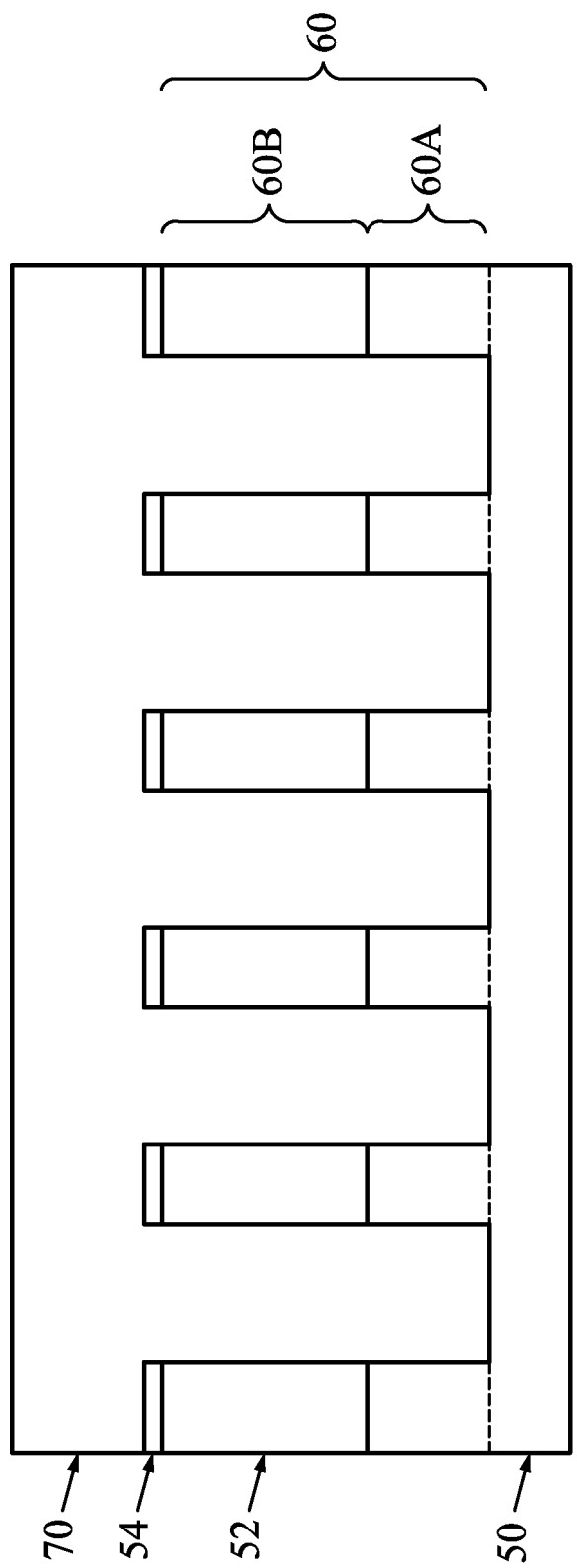

In FIG. 9, an insulation material 70 is formed over the substrate 50 and between neighboring fins 60. The insulation material 70 may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material 70 is silicon oxide formed by a FCVD process. An anneal process may be performed once the insulation material is formed. In an embodiment, the insulation material 70 is formed such that excess portions of the insulation material 70 covers the fins 60.

Figure 10:
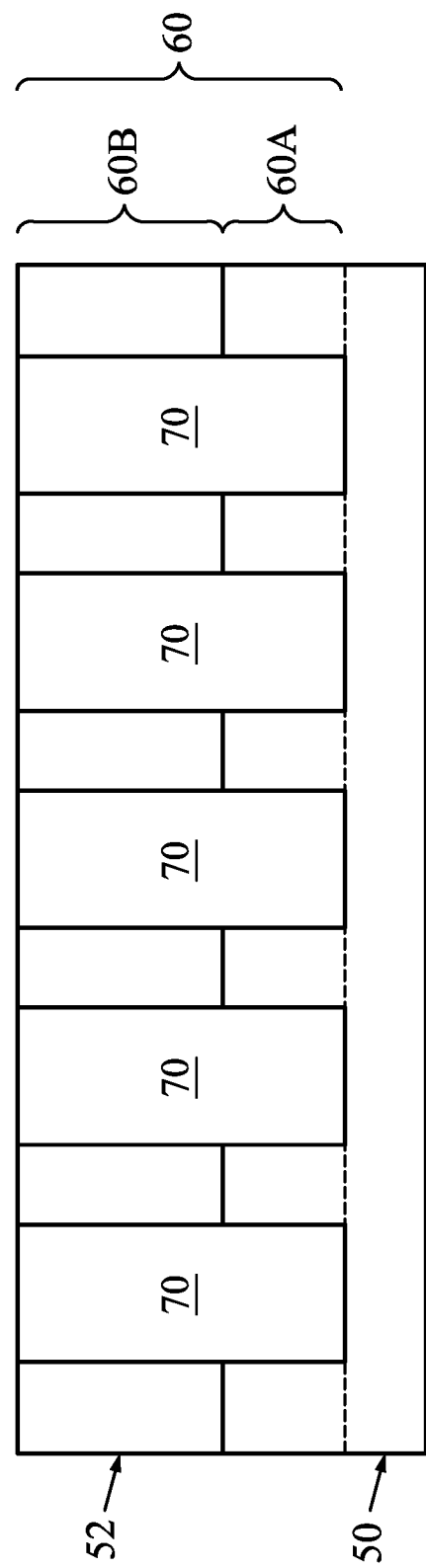

In FIG. 10, a planarization process is applied to the insulation material 70. In some embodiments, the planarization process includes a chemical mechanical polish (CMP), an etch back process, combinations thereof, or the like. The planarization process exposes the fins 60, removing the mask 54. Top surfaces of the fins 60 and the insulation material 70 are level after the planarization process.

Figure 11:
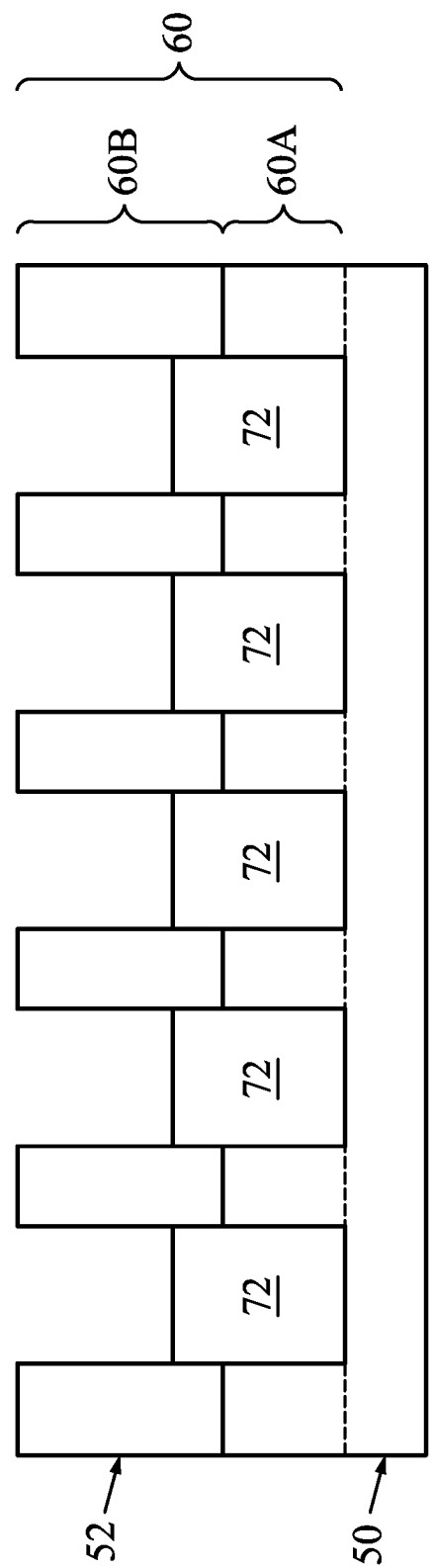

In FIG. 11, the insulation material 70 is recessed to form STI regions 72. The insulation material 70 is recessed such that the second portions 60B of the fins 60 protrude from between neighboring STI regions 72. Further, the top surfaces of the STI regions 72 may have a flat surface as illustrated, a convex surface, a concave surface (such as dishing), or a combination thereof. The top surfaces of the STI regions 72 may be formed flat, convex, and/or concave by an appropriate etch. The STI regions 72 may be recessed using an acceptable etching process, such as one that is selective to the material of the insulation material 70. For example, a chemical oxide removal using a hydrogen source (e.g., ammonia) with a fluorine source (e.g., nitrogen trifluoride), or a chemical oxide removal using dilute hydrofluoric (dHF) acid may be used.

Figure 12:
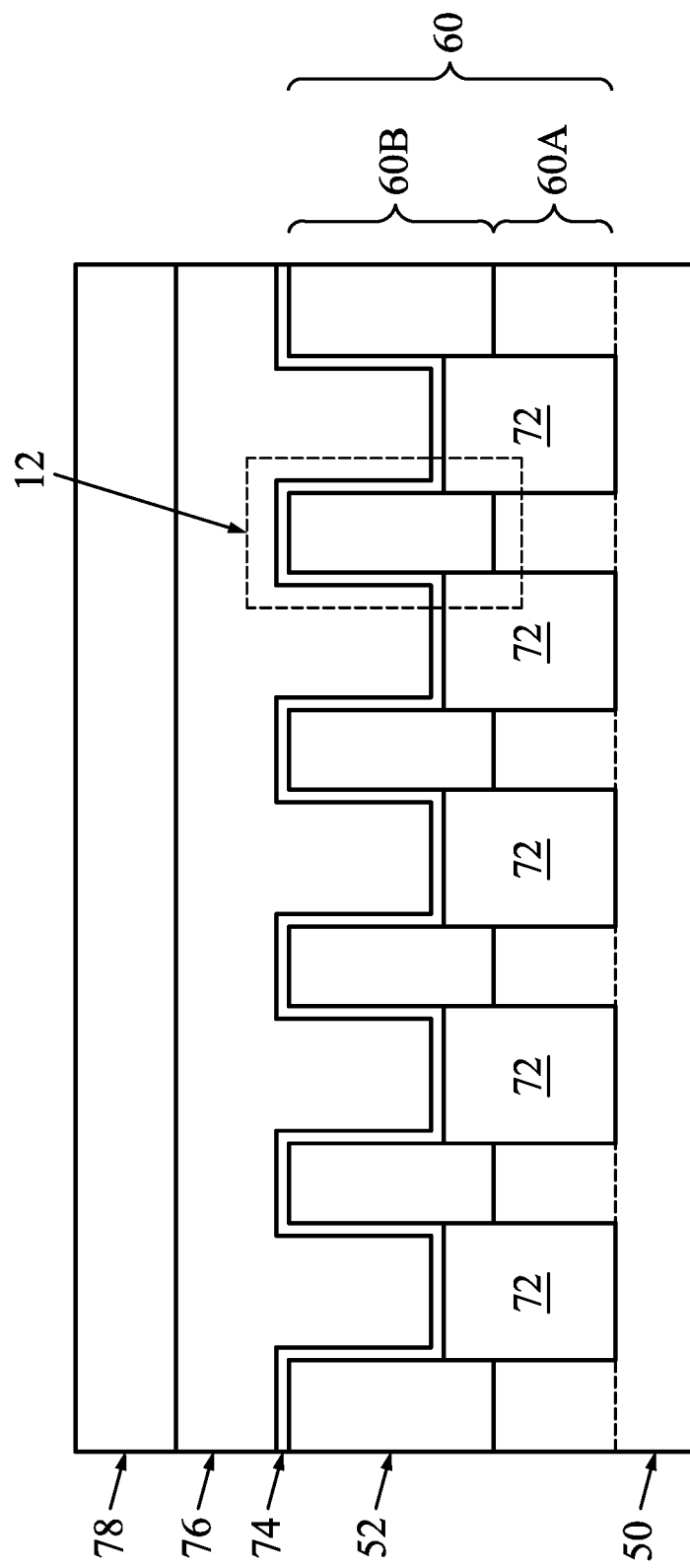

In FIG. 12, a dummy dielectric layer 74 is formed over the fins 60. The dummy dielectric layer 74 may be, for example, silicon oxide, silicon nitride, a combination thereof, or the like, and may be deposited or thermally grown according to acceptable techniques. A dummy gate layer 76 is formed over the dummy dielectric layer 74, and a mask layer 78 is formed over the dummy gate layer 76. The dummy gate layer 76 may be deposited over the dummy dielectric layer 74 and then planarized, such as by a CMP. The dummy gate layer 76 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 76 may be deposited by physical vapor deposition (PVD), CVD, sputter deposition, or other techniques known and used in the art for depositing conductive materials. The dummy gate layer 76 may be made of other materials that have a high etching selectivity from the etching of isolation regions. The mask layer 78 may be deposited over the dummy gate layer 76.

Figure 13:
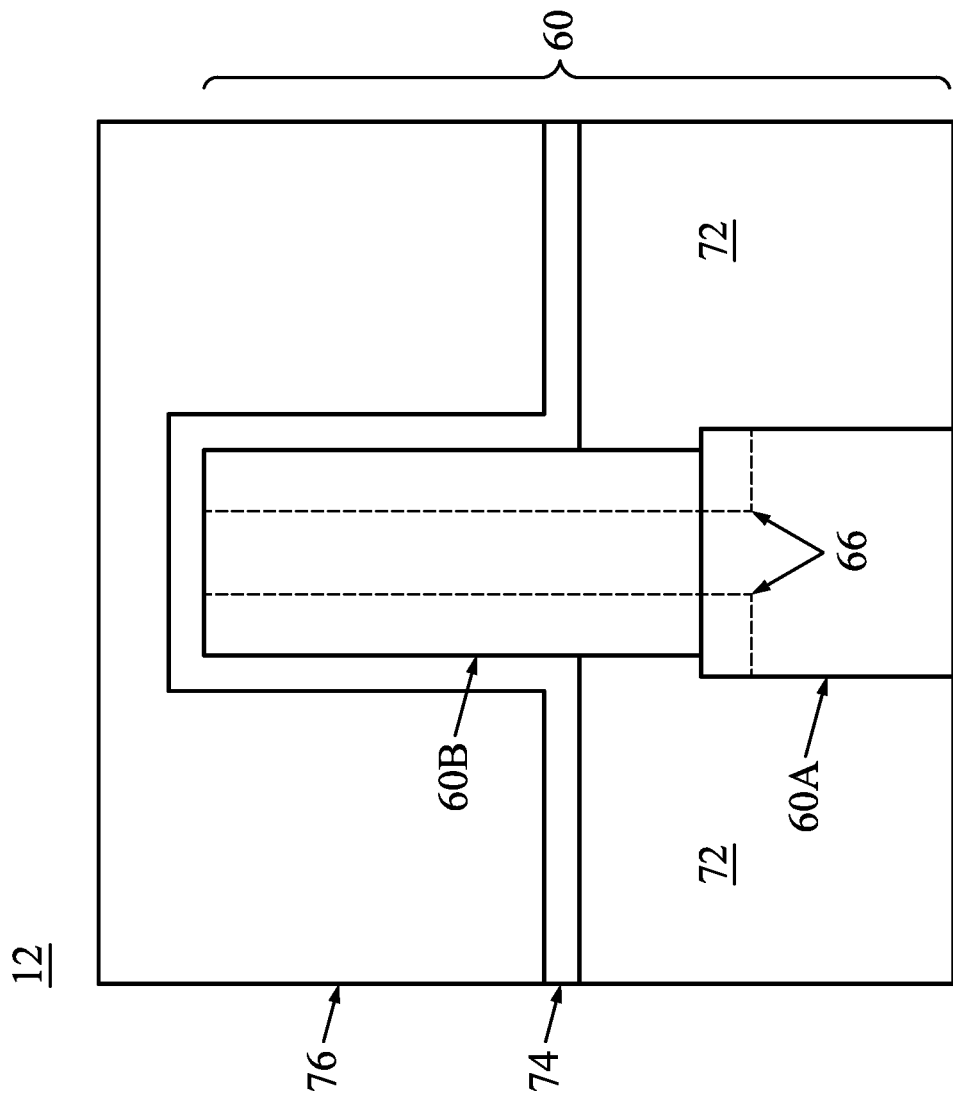

FIG. 13 is a detailed view of a region 12 in FIG. 12, showing additional features. As can be seen, the second portions 60B of the fins 60 protrude from between neighboring STI regions 72, and the first portions 60A of the fins 60 remain buried. Further, the interfaces of the first portions 60A and second portions 60B are located beneath the top surfaces of the STI regions 72.

FIGS. 14A through 20B are cross-sectional views of intermediate stages in the further manufacturing of FinFETs, in accordance with some embodiments. Figures ending with an "A" designation are shown along reference cross-section A-A illustrated in FIG. 1, except for multiple fins/FinFETs. Figures ending with a "B" designation are shown along reference cross-section B-B illustrated in FIG. 1, except for multiple fins/FinFETs. Figures ending with a "C" or "D" designation are shown along reference cross-section C/D-C/D illustrated in FIG. 1, except for multiple fins/FinFETs.

Figures 14A, 14B:
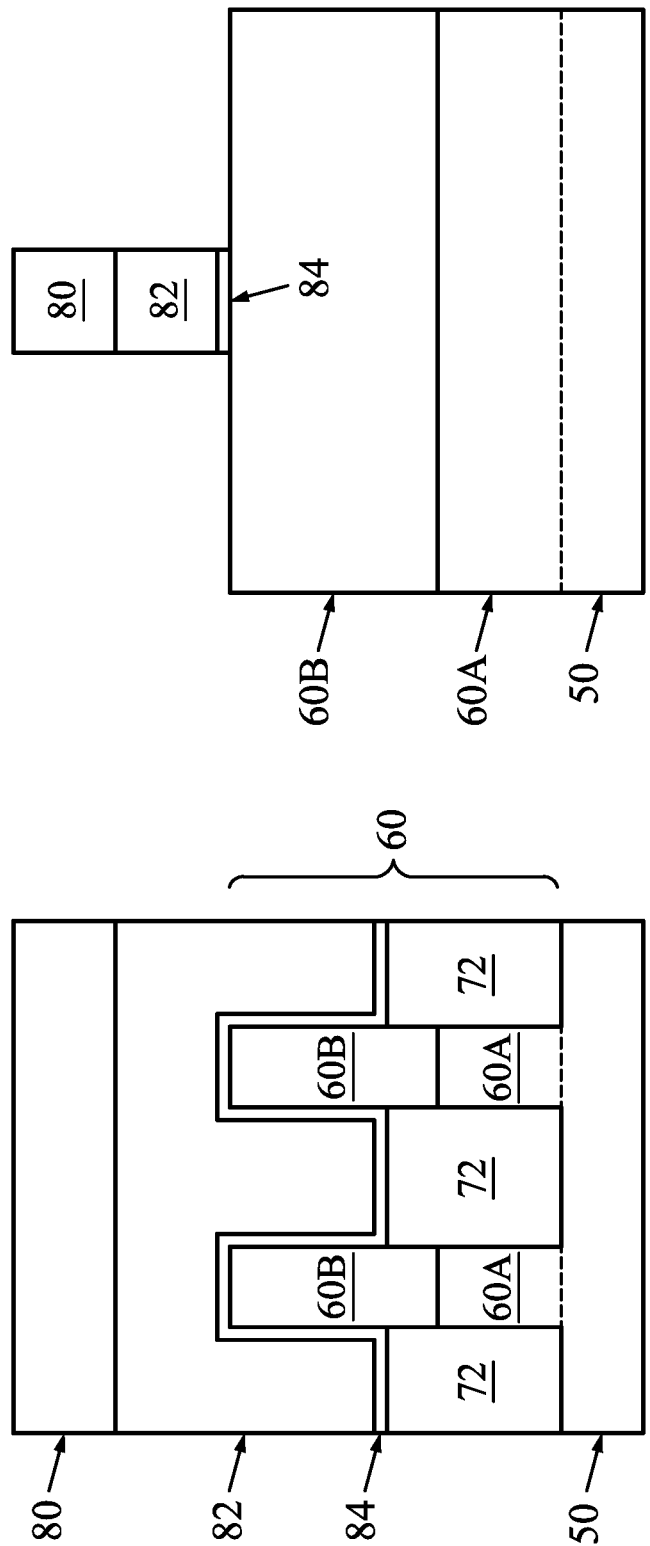

In FIGS. 14A and 14B, the mask layer 78 is patterned using acceptable photolithography and etching techniques to form masks 80. The pattern of the masks 80 then may be transferred to the dummy gate layer 76 and the dummy dielectric layer 74 by an acceptable etching technique to, respectively, form dummy gates 82 and dummy gate dielectric layers 84. The dummy gates 82 and dummy gate dielectric layers 84 cover respective channel regions of the fins 60. The pattern of the masks 80 may be used to physically separate each of the dummy gates 82 from adjacent dummy gates. The dummy gates 82 may also have a lengthwise direction substantially perpendicular to the lengthwise direction of respective epitaxial fins.

In FIGS. 15A, 15B, 15C, and 15D, gate seal spacers 90 can be formed on exposed surfaces of the dummy gates 82 and/or the fins 60. A thermal oxidation or a deposition followed by an anisotropic etch may form the gate seal spacers 90. In some embodiments, the gate seal spacer may be formed of a nitride, such as silicon nitride, silicon oxynitride, silicon carbide, silicon carbonitride, the like, or a combination thereof. The gate seal spacers 90 seal the sidewalls of subsequently formed gate stacks, and may act as additional gate spacing layers.

Further, implants for lightly doped source/drain (LDD) regions 92 may be performed. Appropriate type (e.g., n-type or p-type) impurities may be implanted into the exposed fins 60. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further, gate spacers 94 are formed on the gate seal spacers 90 along sidewalls of the dummy gates 82 and over the LDD regions 92. The gate spacers 94 may be formed by conformally depositing a material and subsequently anisotropically etching the material. The material of the gate spacers 94 may be silicon nitride, SiCN, a combination thereof, or the like. The etch may be selective to the material of the material of the gate spacers 94, such that the LDD regions 92 are not etched during the formation of the gate spacers 94.

Further, epitaxial source/drain regions 96 are formed in the fins 60. The epitaxial source/drain regions 96 are formed in the fins 60 such that each dummy gate 82 is disposed between respective neighboring pairs of the epitaxial source/drain regions 96. In some embodiments, the epitaxial source/drain regions 96 may extend through the LDD regions 92. In some embodiments, the gate seal spacers 90 and gate spacers 94 are used to separate the epitaxial source/drain regions 96 from the dummy gates 82 by an appropriate lateral distance so that the epitaxial source/drain regions 96 do not short out subsequently formed gates of the resulting FinFETs.

The epitaxial source/drain regions 96 may be formed by etching source/drain regions of the fins 60 to form recesses in the fins 60. Then, the epitaxial source/drain regions 96 are epitaxially grown in the recesses. The epitaxial source/drain regions 96 may include any acceptable material, such as appropriate for p-type or n-type FinFETs. For example, in embodiments where p-type devices are formed, the epitaxial source/drain regions 96 may comprise SiGe, SiGeB, Ge, GeSn, or the like. The epitaxial source/drain regions 96 may also have surfaces raised from respective surfaces of the fins 60 and may have facets.

The epitaxial source/drain regions 96 are in situ doped during growth to form source/drain regions. The epitaxial source/drain regions 96 have the same doping type as the respective LDD regions 92, and may be doped with the same dopants or different dopants. The epitaxial source/drain regions 96 may have an impurity concentration of between about $10^{19}$ cm$^{-3}$ and about $10^{21}$ cm$^{-3}$. The n-type and/or p-type impurities for source/drain regions may be any of the impurities previously discussed. Because the epitaxial source/drain regions 96 are in situ doped during growth, they are not doped by implantation. However, the doping profile and concentration of the LDD regions 92 produced according to some embodiments may be similar to that which would be produced if the epitaxial source/drain regions 96 were doped by implantation. Improving the doping profile and concentration of the LDD regions 92 may improve the performance and reliability of the resulting semiconductor devices.

Figures 15A, 15B:
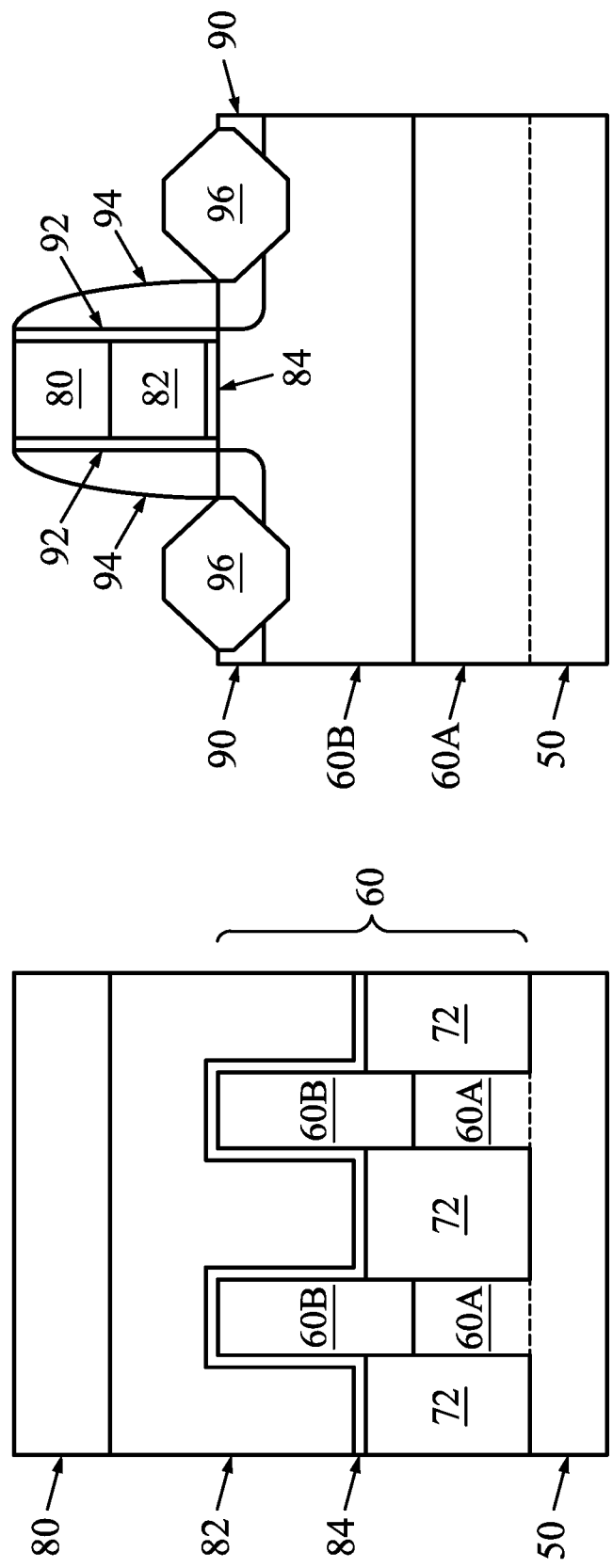
Figure 15D:
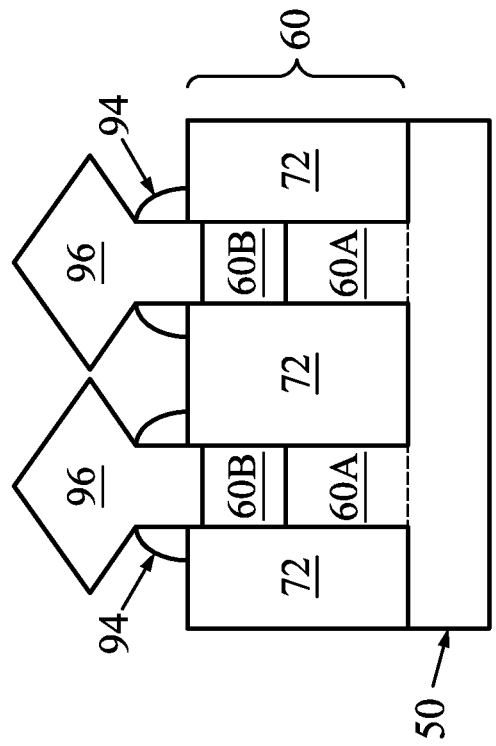
Figure 15C:
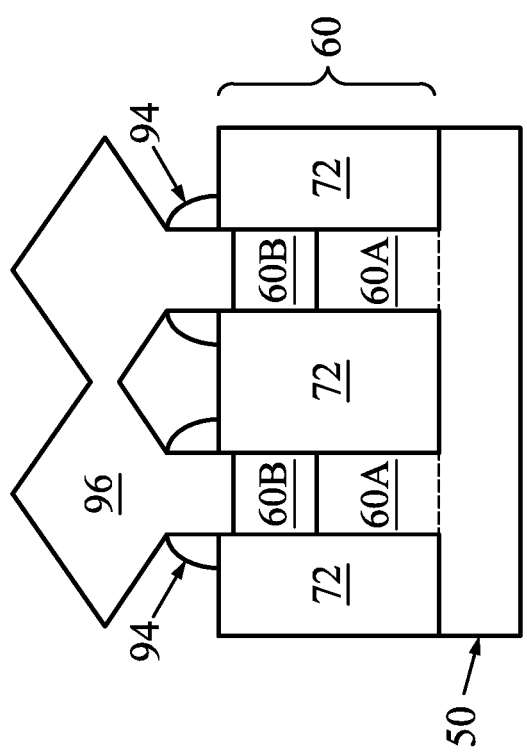

As a result of the epitaxy processes used to form the epitaxial source/drain regions 96, upper surfaces of the epitaxial source/drain regions have facets which expand laterally outward beyond a sidewalls of the fins 60. In some embodiments, these facets cause adjacent epitaxial source/drain regions 96 of a same finFET to merge, as illustrated by the embodiment of FIG. 15C. In other embodiments, adjacent epitaxial source/drain regions 96 remain separated after the epitaxy process is completed, as illustrated by the embodiment of FIG. 15D.

In FIGS. 16A and 16B, an inter-layer dielectric (ILD) 100 is deposited over the fins 60. The ILD 100 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) is disposed between the ILD 100 and the epitaxial source/drain regions 96, the gate spacers 94, the gate seal spacers 90, and the masks 80.

Figures 17A, 17B:
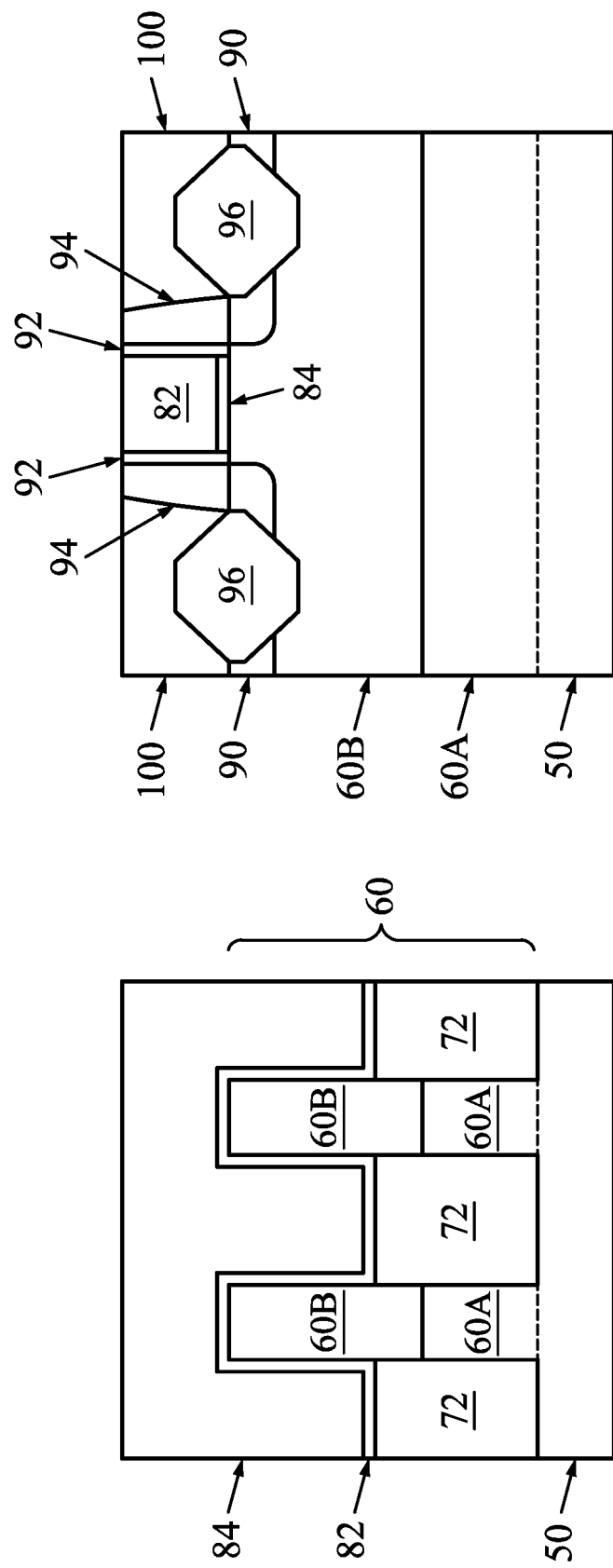

In FIGS. 17A and 17B, a planarization process, such as a CMP, may be performed to level the top surface of the ILD 100 with the top surfaces of the dummy gates 82 and gate seal spacers 90. The planarization process may also remove the masks 80 on the dummy gates 82, and portions of the gate seal spacers 90 and the gate spacers 94 along sidewalls of the masks 80. After the planarization process, top surfaces of the dummy gates 82, the gate seal spacers 90, the gate spacers 94, and the ILD 100 are level. Accordingly, the top surfaces of the dummy gates 82 are exposed through the ILD 100.

Figures 18A, 18B:
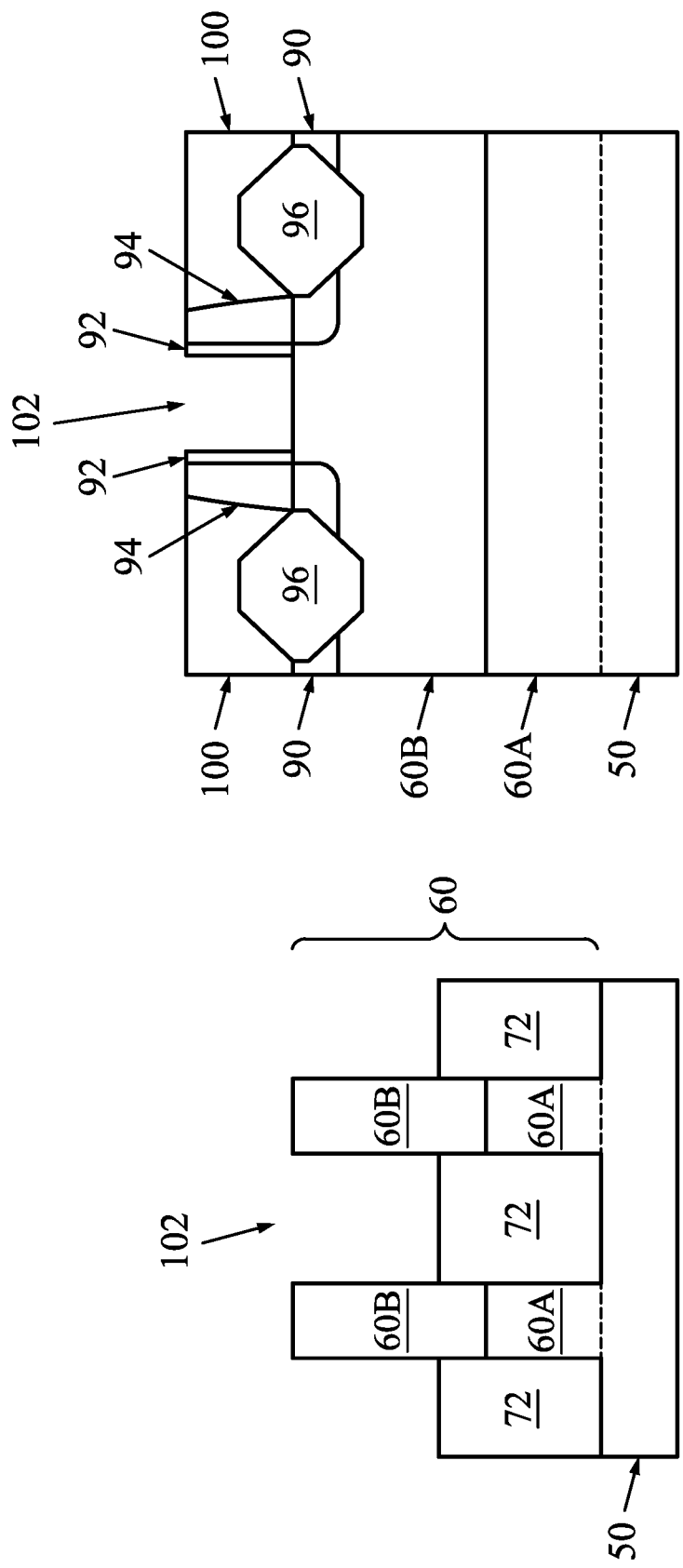

In FIGS. 18A and 18B, the dummy gates 82 and portions of the dummy gate dielectric layers 84 directly underlying the exposed dummy gates 82 are removed in an etching step(s), so that recesses 102 are formed. In some embodiments, the dummy gates 82 are removed by an anisotropic dry etch process that does not remove the material(s) of the gate seal spacers 90 or ILD 100. For example, the etching process may include a dry etch process using reaction gas(es) that selectively etch the dummy gates 82 without etching the ILD 100 or the gate spacers 94. Each recess 102 exposes a channel region of a respective fin 60. Each channel region is disposed between neighboring pairs of the epitaxial source/drain regions 96. During the removal, the dummy gate dielectric layers 84 may be used as an etch stop layer when the dummy gates 82 are etched. The dummy gate dielectric layers 84 may then be removed after the removal of the dummy gates 82.

Figure 19B:
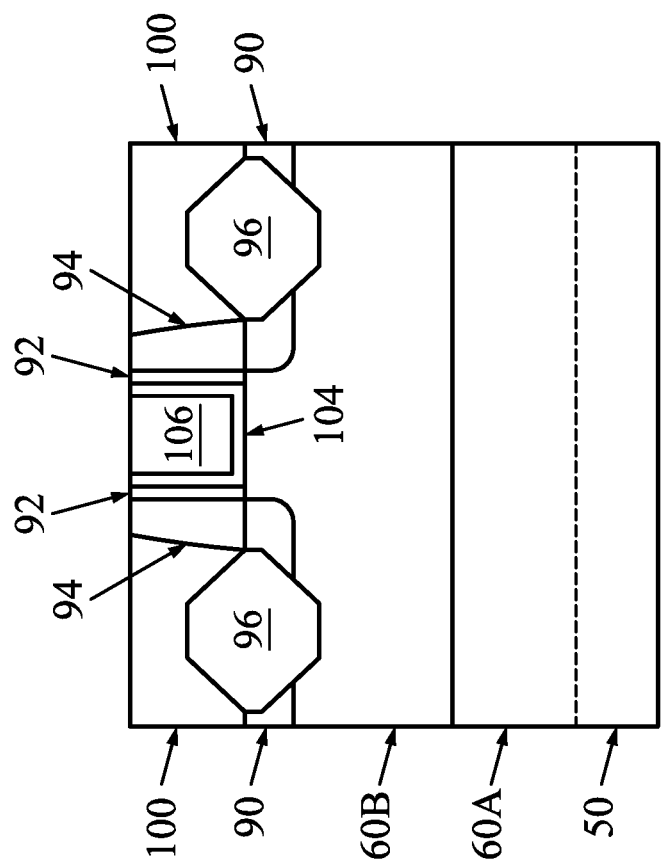
Figure 19A:
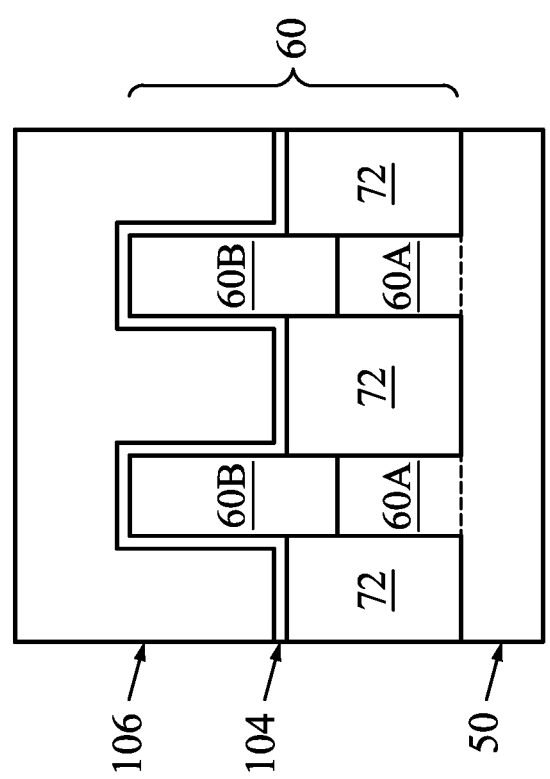

In FIGS. 19A and 19B, gate dielectric layers 104 and gate electrodes 106 are formed in the recesses 102. An interface layer is conformally formed over the fin 60 and in the recesses 102. The interface layer may also cover the upper surface of the ILD 100. The interface layer may be formed by a deposition process, such as a CVD process, a physical vapor deposition (PVD) process, an atomic layer deposition (ALD) process, or the like. The gate dielectric layer 104 is formed over the interface layer. The gate dielectric layer 104 may be deposited conformally in the recesses 102, such as on the top surfaces and the sidewalls of the fins 60. The gate dielectric layer 104 may also be formed along top surfaces of the ILD 100. The gate dielectric layer 104 may be a high-k dielectric material having a k value greater than about 7.0, and may include a metal oxide or a silicate of Hf, Al, Zr, La, Mg, Ba, Ti, Pb, and combinations thereof. The formation methods of the gate dielectric layer 104 may include Molecular-Beam Deposition (MBD), ALD, PECVD, and the like. A gate electrode layer is then deposited over the gate dielectric layer 104 and in the recesses 102. The gate electrode layer may be a metal-containing material such as TiN, TaN, TaC, Co, Ru, Al, combinations thereof, or multi-layers thereof. The gate electrode layer may include any number of work function tuning layers. A planarization process, such as a CMP, is performed to remove the excess portions of the gate dielectric layer 104 and gate electrode layer, which excess portions are over the top surface of the ILD 100. The remaining portions of the gate electrode layer form the gate electrodes 106, which in combination with the other layers, form replacement gates of the resulting Fin-FETs. The gate dielectric layers 104 and gate electrodes 106 may be collectively referred to as the "gates" or "gate stacks" of the resulting FinFETs. The gate stacks may extend along sidewalls of the channel region of the fins 60.

In FIGS. 20A and 20B, an ILD 110 is formed over the gate stacks and ILD 100. In an embodiment, the ILD 110 is a flowable film formed by a flowable CVD method. In some embodiments, the ILD 110 is formed of a dielectric material such as PSG, BSG, BPSG, USG, or the like, and may be deposited by any suitable method, such as CVD and PECVD.

Further, source/drain contacts 112 and gate contacts 114 are formed through the ILDs 100 and 110. Openings for the source/drain contacts 112 are formed through the ILDs 100 and 110, and openings for the gate contacts 114 are formed through the ILD 110. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 110. The remaining liner and conductive material form the source/drain contacts 112 and gate contacts 114 in the openings. An anneal process may be performed to form a silicide at the interface between the epitaxial source/drain regions 96 and the source/drain contacts 112. The source/drain contacts 112 are physically and electrically coupled to the epitaxial source/drain regions 96, and the gate contacts 114 are physically and electrically coupled to the gate electrodes 106. The source/drain contacts 112 and gate contacts 114 may be formed in different processes, or may be formed in the same process. Although shown as being formed in the same cross-sections, it should be appreciated that each of the source/drain contacts 112 and gate contacts 114 may be formed in different cross-sections, which may avoid shorting of the contacts.

In the embodiment described above, the oxidation process 62 is performed after the trenches 56 are etched (see FIGS. 5-6). However, it should be appreciated that the oxidation process 62 may be performed after other steps of a process for forming p-type devices.

Figure 21:
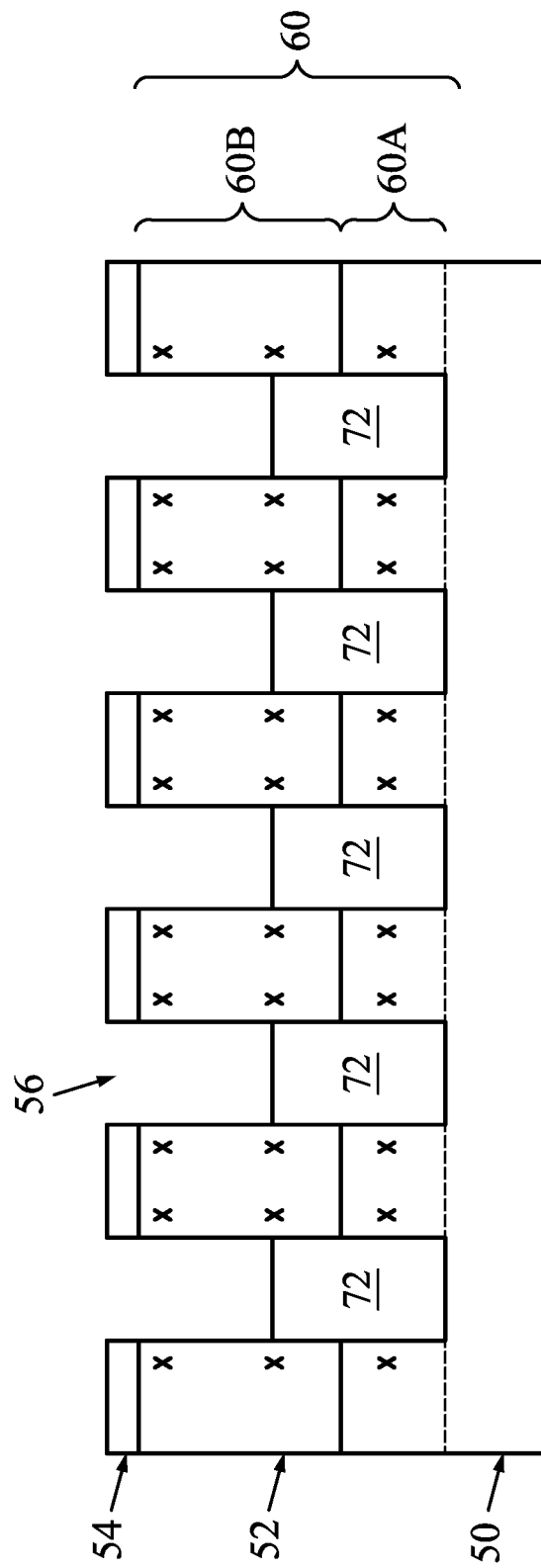
FIGS. 21 through 22 are cross-sectional views of intermediate stages in the manufacturing of FinFETs, in accordance with some other embodiments.
Figure 22:
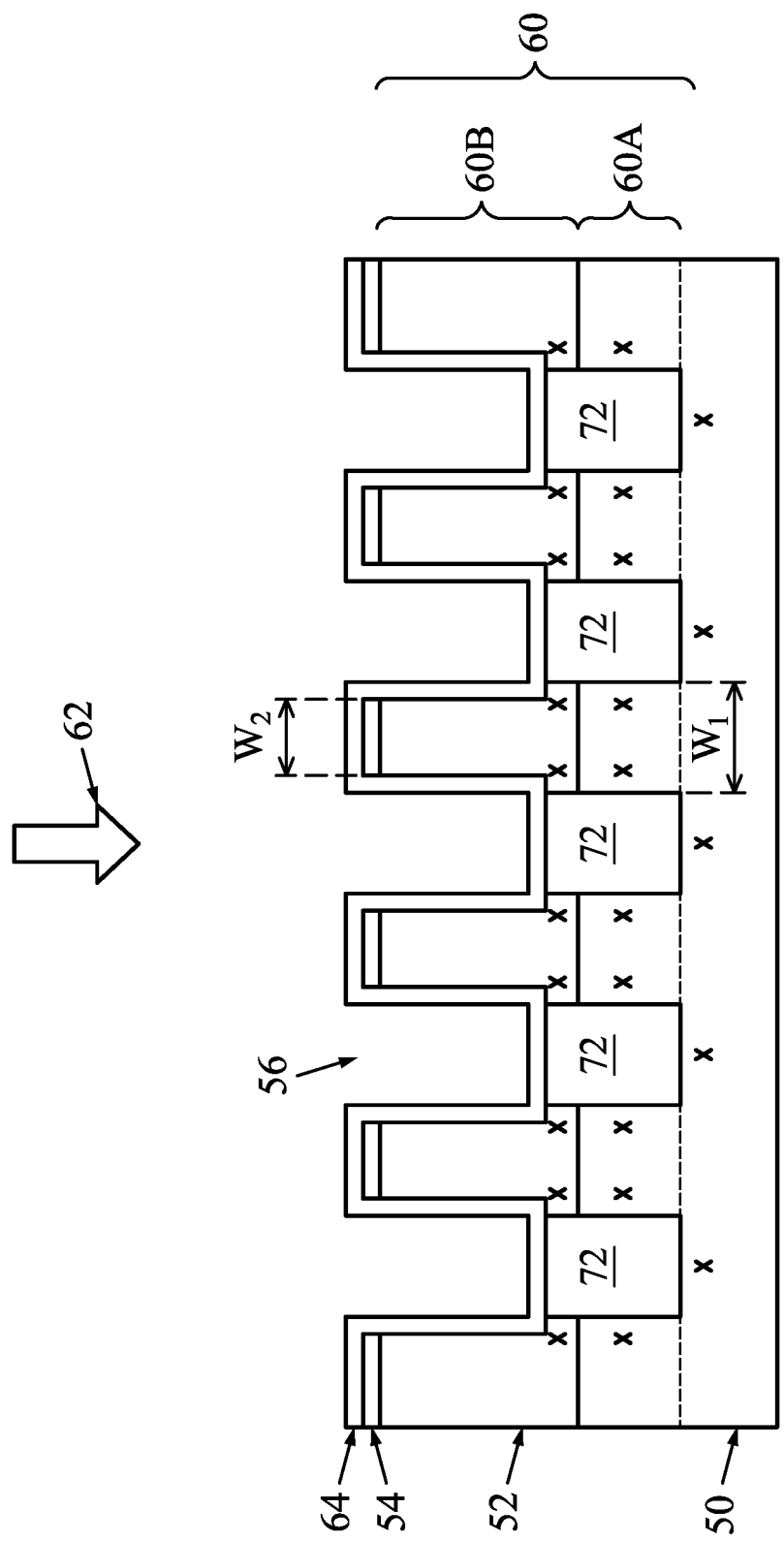
Figure 23:
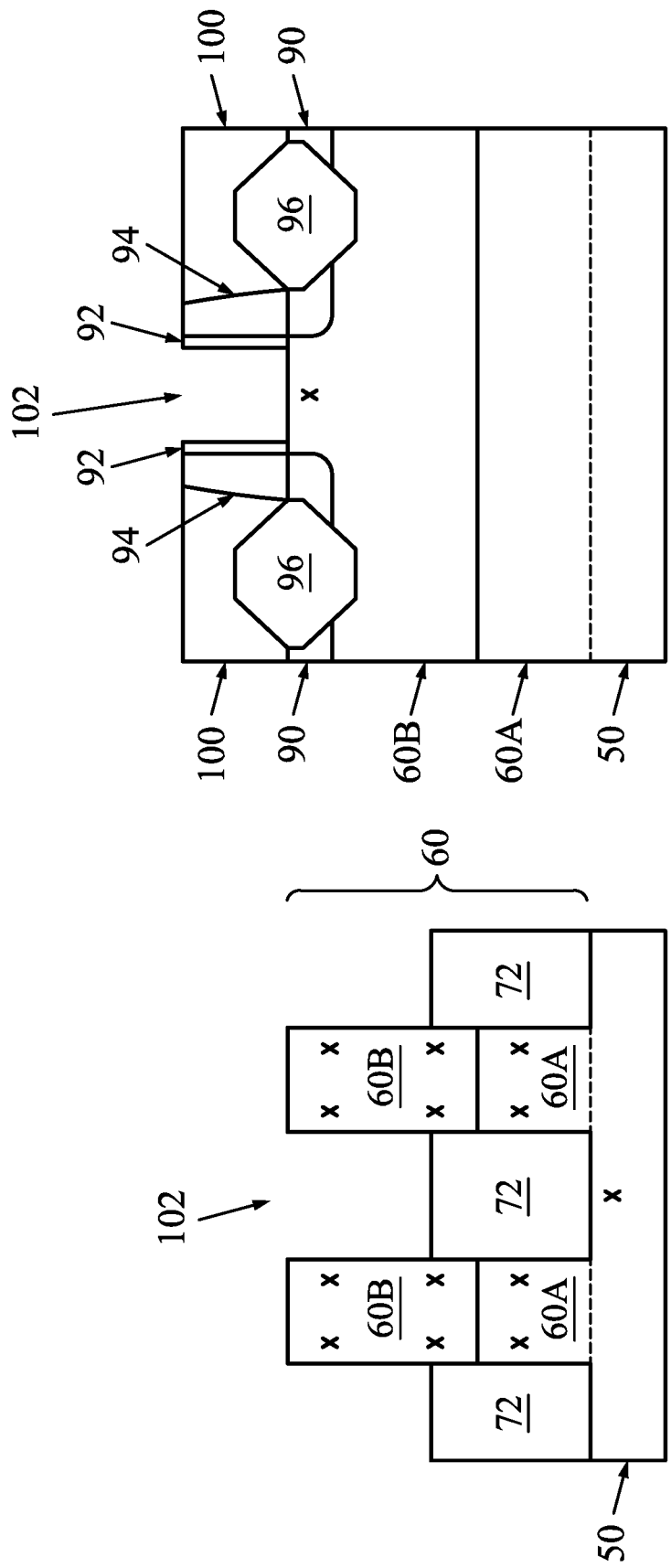
Figure 24:
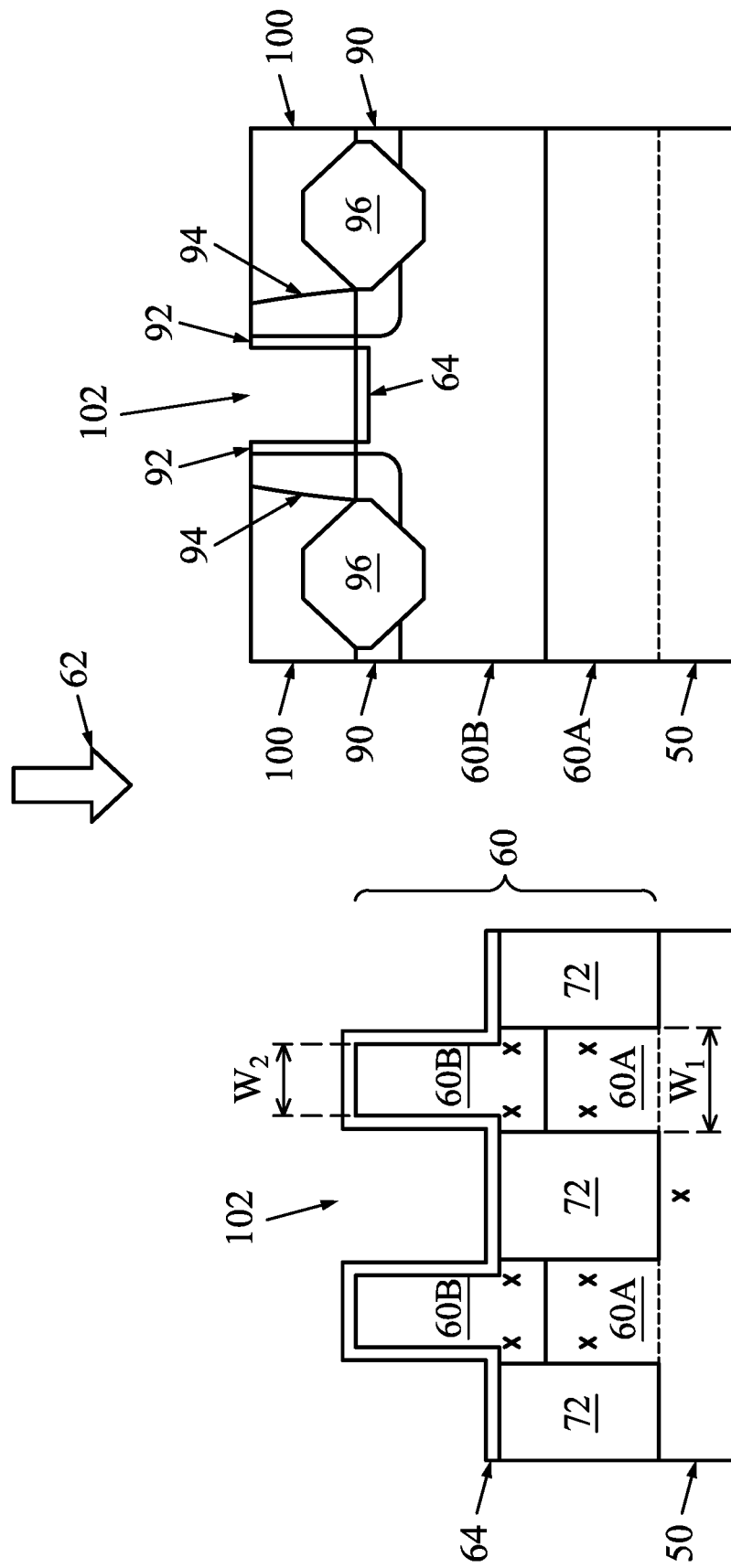

FIGS. 21 through 22 are cross-sectional views of intermediate stages in the manufacturing of FinFETs, in accordance with some other embodiments. Details regarding this embodiment that are similar to those for the previously described embodiment will not be repeated herein.

In the embodiment of FIGS. 21 through 22, the oxidation process 62 is performed after the STI regions 72 are formed. After the trenches 56 are etched, the STI regions 72 are formed in the trenches 56 (see FIG. 21). The oxidation process 62 is then performed (see FIG. 22). As a result, the oxide layer 64 may extend along top surfaces of the STI regions 72. Further, only the of the fins 60 extending above the STI regions 72 have the second width $W_2$. Other regions of the fins 60 (e.g., beneath the top surfaces of the STI regions 72) may retain the first width $W_1$. The oxide layer 64 is then removed.

FIGS. 23A through 24B are cross-sectional views of intermediate stages in the manufacturing of FinFETs, in accordance with some other embodiments. Details regarding this embodiment that are similar to those for the previously described embodiments will not be repeated herein.

In the embodiment of FIGS. 23A through 24B, the oxidation process 62 is performed after the dummy gates 82 and dummy gate dielectric layers 84 are removed. After the recesses 102 are formed, the damaged sides and tops of the fins 60 are exposed (see FIGS. 23A and 23B). In particular, portions of the fins 60 extending above top surfaces of the STI regions 72 are exposed. The oxidation process 62 is then performed (see FIGS. 24A and 24B). As a result, the oxide layer 64 may only extend along portions of the fins 60 exposed by the recesses 102. Further, only the of the fins 60 exposed by the recesses 102 have the second width $W_2$. Other regions of the fins 60 (e.g., beneath the top surfaces of the STI regions 72) may retain the first width $W_1$. The oxide layer 64 is then removed.

Figure 25:
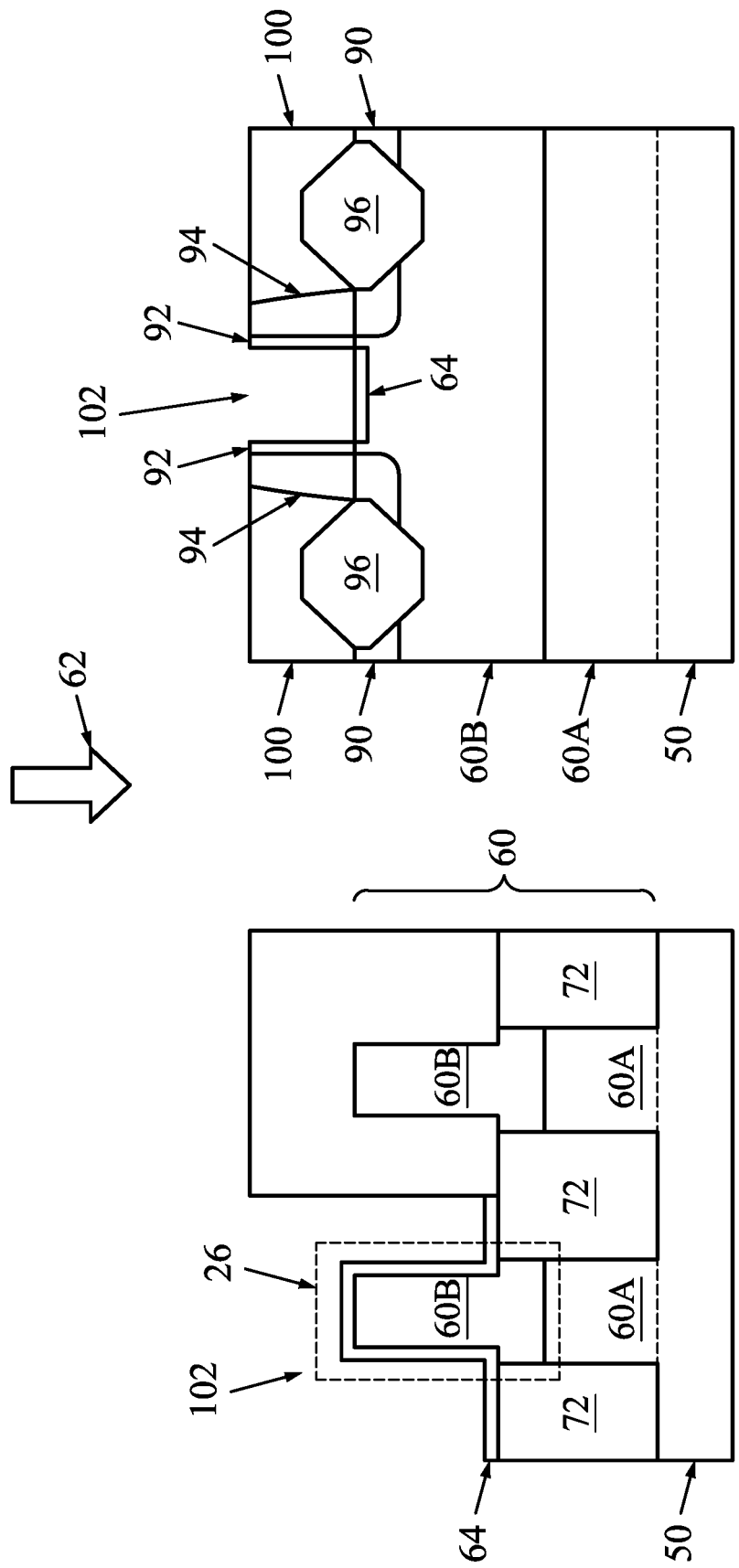
FIGS. 25A, 25B, and 26 are cross-sectional views of intermediate stages in the manufacturing of FinFETs, in accordance with some other embodiments.
Figure 26:
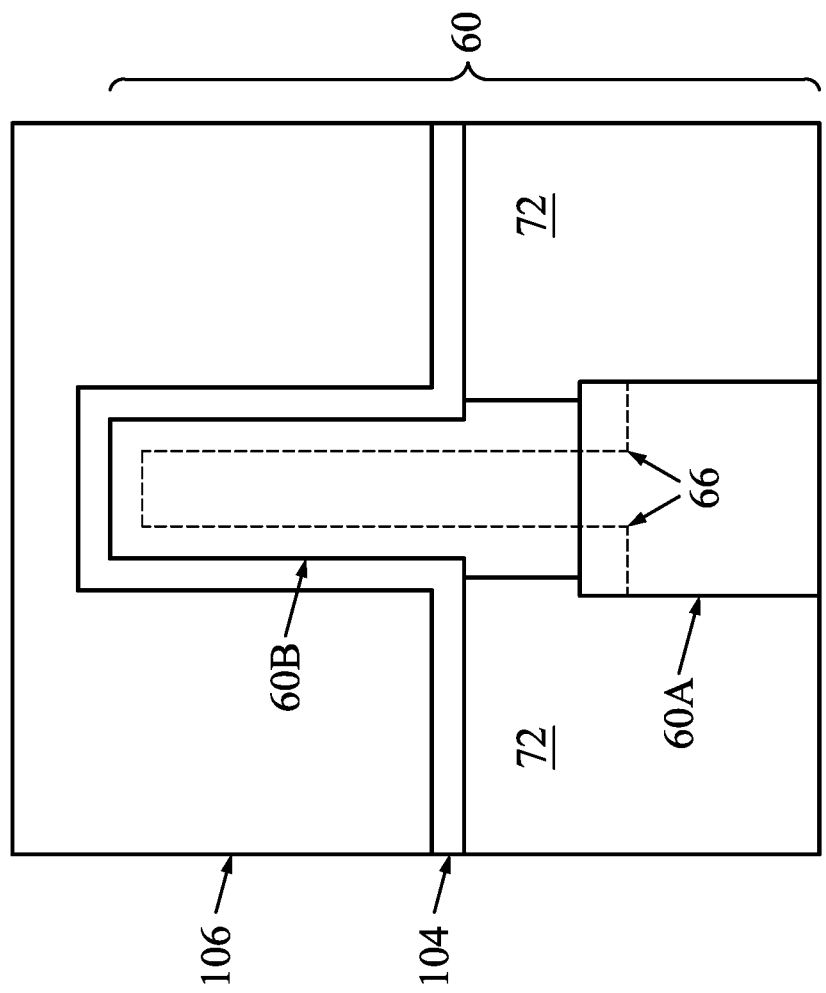

In some embodiments, the oxidation process 62 is performed several times and is performed at different stages of manufacturing. For example, the oxidation process 62 may be performed after the trenches 56 are formed (see FIGS. 5 and 6), after the STI regions 72 are formed in the trenches 56 (see FIGS. 21 and 22), and after the recesses 102 are formed (see FIGS. 23A through 24B). Some subsets of the fins 60 may be masked during the various repetitions of the oxidation process 62. As such, the substrate 50 may have a plurality of fins 60, and different subsets of the fins 60 may have different widths and different concentrations of germanium. FIGS. 25A and 25B are cross-sectional views of intermediate stages in the manufacturing of FinFETs, in accordance with such embodiments. FIGS. 25A and 25B show a similar processing step as FIGS. 24A and 24B, except the oxidation process 62 is repeated while some of the fins 60 are masked. In this embodiment, the oxidation process 62 is performed after the trenches 56 are formed (as described for FIGS. 5 and 6), so that damaged sidewalls of the fins 60 are repaired and a germanium concentration of the second portions 60B of the fins 60 is increased, and the oxidation process 62 is then repeated after the recesses 102 are formed, so that the germanium concentration of the second portions 60B of the fins 60 is further increased. FIG. 26 is a detailed view of a region 26 in FIG. 25A, after the gate dielectric layers 104 and gate electrodes 106 are formed.

Embodiments may achieve advantages. Forming the semiconductor layer 52 (see FIG. 4) with a low germanium concentration may help avoid deformation of fin sidewalls during the etching process(es) for forming the fins 60 (see FIG. 5). Increasing the germanium concentration of the fins 60 after formation by performing the oxidation process 62 (see FIG. 6) may allow the carrier mobility of the fins 60 to be increased after the etching process(es). The channel region mobility of the resulting p-type devices may therefore be increased, and the risk of fin deformation during manufacturing may be lowered.

In an embodiment, a device includes: a substrate; a first semiconductor region extending from the substrate, the first semiconductor region including silicon; a second semiconductor region on the first semiconductor region, the second semiconductor region including silicon germanium, edge portions of the second semiconductor region having a first germanium concentration, a center portion of the second semiconductor region having a second germanium concentration less than the first germanium concentration; a gate stack on the second semiconductor region; and source and drain regions in the second semiconductor region, the source and drain regions being adjacent the gate stack.

In some embodiments of the device, edge portions of the first semiconductor region have a third germanium concentration, a center portion of the first semiconductor region having a fourth germanium concentration less than the third germanium concentration. In some embodiments of the device, the gate stack includes: a gate dielectric extending along the edge portions of the second semiconductor region and along a top surface of the second semiconductor region; and a gate electrode on the gate dielectric. In some embodiments of the device, the first semiconductor region has a first width, the second semiconductor region has a second width, and the first width is greater than the second width. In some embodiments of the device, first portions of the second semiconductor region have the first width, and second portions of the second semiconductor region have the second width. In some embodiments, the device further includes: an isolation region adjacent the first semiconductor region and the second semiconductor region, portions of the first and second semiconductor regions contacting the isolation region being damaged.

In an embodiment, a method includes: providing a substrate including silicon; growing a semiconductor layer on the substrate, the semiconductor layer including silicon germanium; etching trenches in the semiconductor layer and the substrate to form a fin from portions of the semiconductor layer and substrate between the trenches; oxidizing the fin to form an oxide layer along sides of the fin, a germanium concentration of the fin at the sides of the fin being increased after oxidation; removing the oxide layer from the sides of the fin; and forming a metal gate stack along a top surface and the sides of the fin.

In some embodiments of the method, the fin includes a first portion and a second portion, the first portion including the portions of the substrate between the trenches, the second portion including the portions of the semiconductor layer between the trenches, and where oxidizing the fin decreases a width of the second portion of the fin. In some embodiments of the method, etching trenches in the semiconductor layer and the substrate damages the sides of the first and second portions of the fin, and where the sides of the second portion of the fin are repaired after oxidation. In some embodiments of the method, the sides of the first portion of the fin are repaired after oxidation. In some embodiments of the method, before removing the oxide layer, portions of the oxide layer extending along the first portion of the fin have a first thickness, portions of the oxide layer extending along the second portion of the fin have a second thickness, and the second thickness is greater than the first thickness. In some embodiments of the method, during oxidation, germanium is driven from the second portion of the fin into the first portion of the fin. In some embodiments, the method further includes: after oxidizing the fin, forming an isolation region around the fin. In some embodiments, the method further includes: before oxidizing the fin, forming an isolation region around the fin. In some embodiments, the method further includes: before oxidizing the fin, forming a dummy gate stack along the top surface and the sides of the fin; and before forming the metal gate stack, removing the dummy gate stack.

In an embodiment, a method includes: growing a semiconductor layer on a substrate, the substrate including silicon, the semiconductor layer including silicon germanium, the semiconductor layer having a uniform germanium concentration after the growing; etching a trench in the semiconductor layer and the substrate; oxidizing sidewalls of the semiconductor layer and the substrate exposed by the trench to form an oxide layer in the trench, the semiconductor layer having a non-uniform germanium concentration after the oxidizing, the germanium concentration at sidewalls of the semiconductor layer after the oxidizing being greater than the germanium concentration at sidewalls of the semiconductor layer before the oxidizing; removing the oxide layer; and depositing an insulation material in the trench.

In some embodiments of the method, oxidizing the sidewalls of the semiconductor layer and the substrate includes: performing a rapid thermal anneal in an oxygen-containing environment, the rapid thermal anneal performed at a temperature of from about 600° C. to about 1200° C. In some embodiments of the method, the oxygen-containing environment is formed by introducing water vapor, molecular oxygen, or ozone to the environment. In some embodiments of the method, portions of the oxide layer extending along sidewalls of the semiconductor layer have a first thickness, portions of the oxide layer extending along sidewalls of the substrate have a second thickness, and the first thickness is greater than the second thickness. In some embodiments of the method, sidewalls of the semiconductor layer have a first quantity of defects before the oxidizing, and a second quantity of defects after the oxidizing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a substrate comprising silicon;
   growing a semiconductor layer on the substrate, the semiconductor layer comprising silicon germanium;
   etching trenches in the semiconductor layer and the substrate to form a fin from portions of the semiconductor layer and substrate between the trenches;
   oxidizing the fin to form a first oxide layer along sides of the fin, a germanium concentration of the fin at the sides of the fin being increased after oxidation;
   removing the first oxide layer from the sides of the fin;
   after removing the first oxide layer from the sides of the fin, forming a dummy gate along a top surface and the sides of the fin;
   removing the dummy gate;
   after removing the dummy gate, oxidizing the fin to form a second oxide layer along the sides of the fin, the germanium concentration of the fin at the sides of the fin being increased after oxidation;
   removing the second oxide layer from the sides of the fin; and
   after removing the second oxide layer from the sides of the fin, forming a metal gate along the top surface and the sides of the fin.

2. The method of claim 1, wherein the fin comprises a first portion and a second portion, the first portion comprising the portions of the substrate between the trenches, the second portion comprising the portions of the semiconductor layer between the trenches, and wherein oxidizing the fin to form the first oxide layer decreases a width of the second portion of the fin.

3. The method of claim 2, wherein etching trenches in the semiconductor layer and the substrate damages the sides of the first and second portions of the fin, wherein etching trenches in the semiconductor layer and the substrate does not comprise performing a cleaning process so that the sides of the first and second portions of the fin remain damaged after the fin is formed, and wherein the sides of the second portion of the fin are repaired after oxidation.

4. The method of claim 3, wherein the sides of the first portion of the fin are repaired after oxidation.

5. The method of claim 2, wherein, before removing the first oxide layer, portions of the first oxide layer extending along the first portion of the fin have a first thickness, portions of the first oxide layer extending along the second portion of the fin have a second thickness, and the second thickness is greater than the first thickness.

6. The method of claim 2, wherein, during oxidation, germanium is driven from the second portion of the fin into the first portion of the fin.

7. The method of claim 1, further comprising:
after oxidizing the fin to form the first oxide layer and before forming the dummy gate, forming an isolation region around the fin.

8. The method of claim 1, further comprising:
before oxidizing the fin to form the first oxide layer, forming an isolation region around the fin.

9. A method comprising:
growing a semiconductor layer on a substrate, the substrate comprising silicon, the semiconductor layer comprising silicon germanium, the semiconductor layer having a uniform germanium concentration after the growing;
etching a first trench and a second trench in the semiconductor layer and the substrate;
oxidizing sidewalls of the semiconductor layer and the substrate in the first trench and the second trench with a first oxidation process, the semiconductor layer having a non-uniform germanium concentration after the first oxidation process, the germanium concentration at sidewalls of the semiconductor layer after the first oxidation process being greater than the germanium concentration at sidewalls of the semiconductor layer before the first oxidation process; and
after the first oxidation process, oxidizing sidewalls of the semiconductor layer and the substrate in the second trench with a second oxidation process, the sidewalls of the semiconductor layer and the substrate exposed by the first trench being masked during the second oxidation process, the second trench having a different width than the first trench after the second oxidation process.

10. The method of claim 9, wherein oxidizing the sidewalls of the semiconductor layer and the substrate in the first trench and the second trench comprises:
performing a rapid thermal anneal in an oxygen-containing environment, the rapid thermal anneal performed at a temperature of from about 600° C. to about 1200° C.

11. The method of claim 9, wherein the first oxidation process forms a first oxide layer in the first trench and the second trench, portions of the first oxide layer extending along sidewalls of the semiconductor layer have a first thickness, portions of the first oxide layer extending along sidewalls of the substrate have a second thickness, and the first thickness is greater than the second thickness.

12. The method of claim 9, wherein sidewalls of the semiconductor layer have a first quantity of defects before the first oxidation process, and a second quantity of defects after the first oxidation process.

13. The method of claim 9 further comprising:
forming isolation regions in the first trench and the second trench;
forming dummy gates in the first trench and the second trench;
removing the dummy gates to re-expose the sidewalls of the semiconductor layer and the substrate exposed by the first trench and the second trench; and forming metal gates in the first trench and the second trench.

14. The method of claim 9 further comprising:
forming dummy gates in the first trench and the second trench;
removing the dummy gates to re-expose the sidewalls of the semiconductor layer and the substrate exposed by the first trench and the second trench, wherein the second oxidation process is performed after removing the dummy gates; and
after the second oxidation process, forming metal gates in the first trench and the second trench.

15. A method comprising:
growing a silicon germanium layer on a silicon substrate;
patterning the silicon germanium layer and the silicon substrate to form a fin comprising a first portion and a second portion, the first portion comprising a patterned portion of the silicon substrate, the second portion comprising a patterned portion of the silicon germanium layer, wherein the patterning damages sidewalls of the fin;
after patterning the silicon germanium layer and the silicon substrate, oxidizing the sidewalls of the fin to form a first oxide layer on the sidewalls of the fin, wherein the oxidizing repairs the sidewalls of the fin and increases a germanium concentration of the second portion of the fin;
after oxidizing the sidewalls of the fin, removing the first oxide layer from the sidewalls of the fin;
forming an isolation region around the fin;
forming a dummy gate stack along a top surface and the sidewalls of the fin;
removing the dummy gate stack;
after removing the dummy gate stack, oxidizing the sidewalls of the fin to form a second oxide layer on the sidewalls of the fin, wherein the oxidizing further increases the germanium concentration of the second portion of the fin;
removing the second oxide layer from the sidewalls of the fin; and
forming a metal gate stack along the top surface and the sidewalls of the fin.

16. The method of claim 15, wherein the patterning the silicon germanium layer and the silicon substrate does not comprise performing a cleaning process.

17. The method of claim 15, wherein before the oxidizing the sidewalls of the fin to form the first oxide layer, the first portion and the second portion of the fin each have a first width, and wherein after the oxidizing the sidewalls of the fin to form the first oxide layer, the first portion of the fin has a second width and the second portion of the fin has a third width, the second width and the third width each less than the first width.

18. The method of claim 17, wherein the third width is less than the second width.

19. The method of claim 15, wherein after the oxidizing the sidewalls of the fin to form the first oxide layer, the germanium concentration of the second portion of the fin increases in a direction extending from a center of the fin to the sidewalls of the fin.

20. The method of claim 15, wherein forming the dummy gate stack comprises forming a dummy dielectric layer along the top surface and the sidewalls of the fin, the first oxide layer removed before the dummy dielectric layer is formed.

* * * * *